United States Patent
Ingle et al.

(10) Patent No.: US 10,616,512 B2
(45) Date of Patent: Apr. 7, 2020

(54) SYSTEMS, METHODS, AND MEDIA FOR HIGH DYNAMIC RANGE IMAGING USING DEAD-TIME-LIMITED SINGLE PHOTON DETECTORS

(71) Applicant: Wisconsin Alumni Research Foundation, Madison, WI (US)

(72) Inventors: Atul Nishikant Ingle, Madison, WI (US); Mohit Gupta, Madison, WI (US); Andreas Velten, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 16/047,933

(22) Filed: Jul. 27, 2018

(65) Prior Publication Data

US 2020/0036918 A1    Jan. 30, 2020

(51) Int. Cl.
| | |
|---|---|
| *H04N 5/355* | (2011.01) |
| *H04N 5/369* | (2011.01) |
| *H04N 5/3745* | (2011.01) |
| *H04N 5/374* | (2011.01) |
| *H01L 31/107* | (2006.01) |
| *H01L 27/146* | (2006.01) |

(52) U.S. Cl.
CPC ....... *H04N 5/35509* (2013.01); *H04N 5/3696* (2013.01); *H04N 5/3742* (2013.01); *H04N 5/3745* (2013.01); *H01L 27/14643* (2013.01); *H01L 31/107* (2013.01)

(58) Field of Classification Search
CPC .......... H01L 27/146–14893; H04N 5/335–379
See application file for complete search history.

(56) References Cited

U.S. PATENT DOCUMENTS

| | | |
|---|---|---|
| 8,426,797 B2 | 4/2013 | Aull |
| 8,710,424 B2 | 4/2014 | Shaver |
| 8,716,643 B2 | 5/2014 | Eldesouki |
| 8,841,596 B2 | 9/2014 | Thomas |
| 9,210,350 B2 | 12/2015 | Dai |

(Continued)

OTHER PUBLICATIONS

Antolovic, I. M., et al., SPAD imagers for super resolution localization microscopy enable analysis of fast fluorophore blinking. Scientific Reports 7, 44108 (2017).

(Continued)

*Primary Examiner* — Paul M Berardesca
(74) *Attorney, Agent, or Firm* — Quarles & Brady LLP

(57) ABSTRACT

In accordance with some embodiments, systems, methods and media for high dynamic range imaging using dead-time-limited single photon detectors are provided. In some embodiments, a system for high dynamic range imaging is provided, comprising: an image sensor comprising: a pixels comprising: a single photon detector having dead time $\tau_d$; and a counter coupled to an output of the single photon detector, wherein the counter is configured to increment in response to a signal indicative of detection of a photon output by the single photon detector; and a processor that is programmed to: read out a value stored by the counter after an exposure time has elapsed; and calculate an intensity for the pixel based on the value and the dead time $\tau_d$.

27 Claims, 14 Drawing Sheets

600

(56) References Cited

U.S. PATENT DOCUMENTS

| | | | |
|---|---|---|---|
| 9,596,421 B1 | 3/2017 | Itzler | |
| 9,654,738 B1 | 5/2017 | Ferguson | |
| 9,955,090 B2 | 4/2018 | Yang | |
| 2016/0373676 A1* | 12/2016 | Zhang | H04N 5/374 |
| 2018/0211990 A1* | 7/2018 | Yorikado | G02B 3/00 |
| 2018/0343406 A1* | 11/2018 | Ikedo | H04N 5/369 |

OTHER PUBLICATIONS

Blackwell, H. R. Contrast thresholds of the human eye. Journal of the Optical Society of America 36, 624 (1946).

Brady, D. J. et al. Multiscale gigapixel photography. Nature 486, 386-389 (2012).

Buttafava et al., "Time-gated single-photon detection module with 110 ps transition time and up to 80 MHz repetition rate," Rev. Sci. Instrum. (2014).

Buttafava, M., et al., Non-line-of-sight imaging using a time-gated single photon avalanche diode. Opt. Express 23, 20997-21011 (2015).

Debevec, P. E., et al., "Recovering high dynamic range radiance maps from photographs: Proceedings of the 24th Annual Conference on Computer Graphics and Interactive Techniques." Los Angeles, USA: SIGGRAPH (1997).

Fossum, E., et al., The quanta image sensor: Every photon counts. Sensors 16, 1260 (2016).

Gariepy et al., Single photon sensitive light-in-flight imaging, Nature Comm. 2015.

Gariepy, G., et al., Detection and tracking of moving objects hidden from view. Nature Photonics 10, 23-26 (2016).

Kavadias, S. et al. A logarithmic response cmos image sensor with on-chip calibration. IEEE Journal of Solid-State Circuits 35, 1146-1152 (2000).

Kirmani, A. et al. First-photon imaging. Science 343, 58-61 (2014).

Marcinczak et al., Closed Contour Specular Reflection Segmentation in Laparoscopic Images, Int. J. Biomedical Imaging, 2013.

Marois, C. et al. Direct imaging of multiple planets orbiting the star HR 8799. Science 322, 1348-1352 (2008).

Nayar et al., Adaptive dynamic range imaging: optical control of pixel exposures over space and time. In Proceedings Ninth IEEE International Conference on Computer Vision (IEEE, 2003).

Nayar, S.K., et al., "High dynamic range imaging: Spatially varying pixel exposures." Proceedings IEEE Conference on Computer Vision and Pattern Recognition. CVPR 2000 (Cat. No. PR00662). vol. 1. IEEE, 2000.

Niehörster, T. et al. Multi-target spectrally resolved fluorescence lifetime imaging microscopy. Nature methods 13, 257 (2016).

Robinson, H. P. On printing photographic pictures from several negatives. British Journal of Photography 7, 94 (1860).

Shin, D. et al. Photon-efficient imaging with a single-photon camera. Nature Communications 7, 12046 (2016).

Tinsley, J. N. et al. Direct detection of a single photon by humans. Nature Communications 7, 12172 (2016).

Tocci, M. D., et al., A versatile hdr video production system. ACM Transactions on Graphics (TOG) 30, 41 (2011).

Trautmann, S, et al. "Fluorescence lifetime imaging (FLIM) in confocal microscopy applications: an overview." Application Note, PicoQuant, GmbH, Berlin, Germany (2013).

Vinegoni, C. et al. Real-time high dynamic range laser scanning microscopy. Nature Communications 7,11077 (2016).

Yang, F., et al., Bits from photons: Oversampled image acquisition using binary poisson statistics. IEEE Transactions on Image Processing 21, 1421-1436 (2012).

Yole Développement—Imaging Technologies for Automotive 2016 report—Oct. 2016.

Casella, G. et al., Statistical Inference (Pacific Grove, CA: Duxbury/Thomson Learning, 2002),2 edn. Sec. 5.5.4.

\* cited by examiner

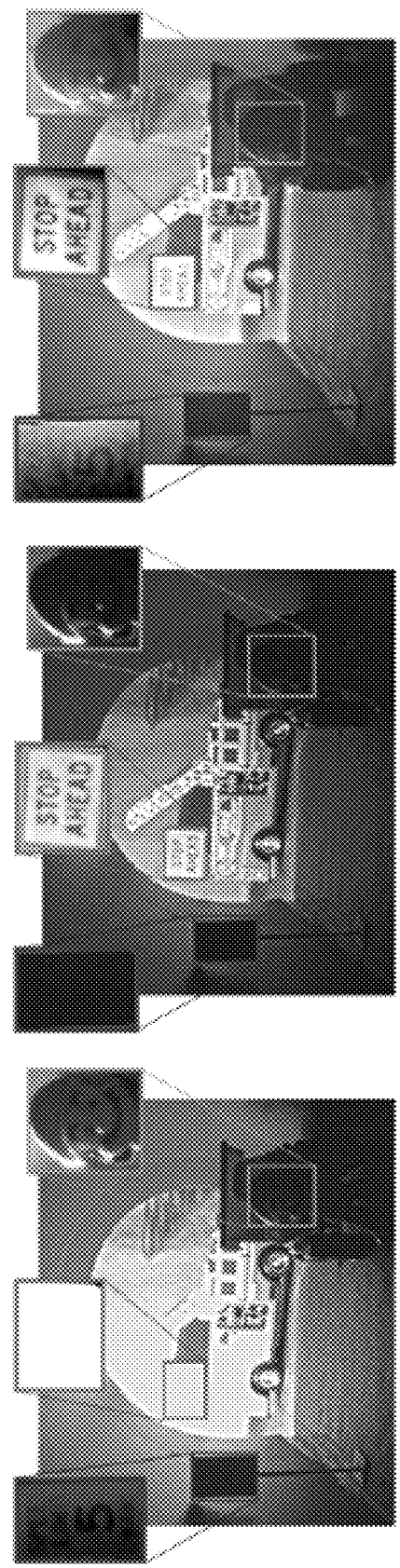
FIG. 17A  CMOS 5 ms
FIG. 17B  CMOS 1 ms
FIG. 17C  SPAD 5 ms

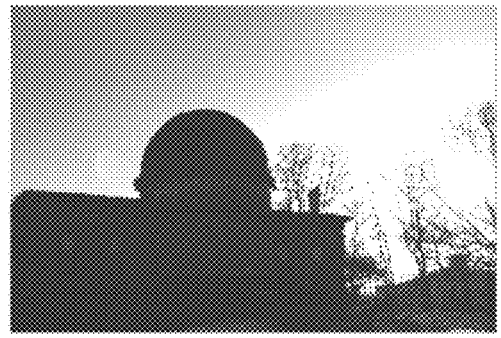
FIG. 18A
Ground Truth
 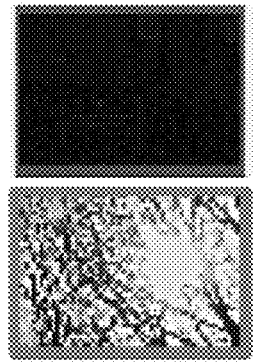
FIG. 18B
Conv. Pixels 5 ms
 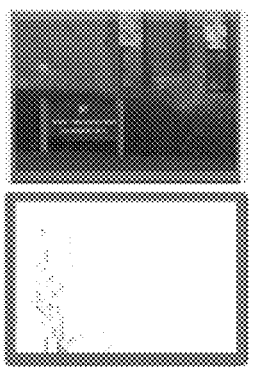
FIG. 18C
Conv. Pixels 1 ms
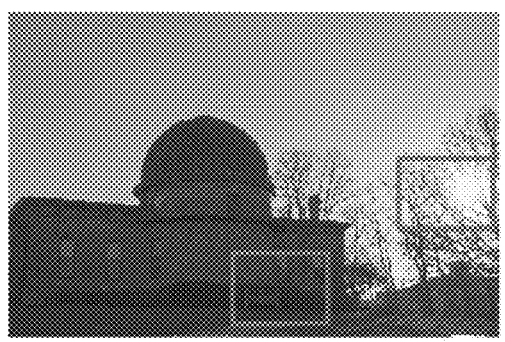 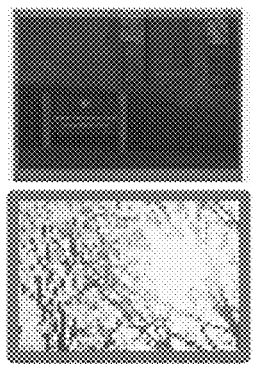
FIG. 18D
SPAD 5 ms

SYSTEMS, METHODS, AND MEDIA FOR HIGH DYNAMIC RANGE IMAGING USING DEAD-TIME-LIMITED SINGLE PHOTON DETECTORS

STATEMENT REGARDING FEDERALLY SPONSORED RESEARCH

This invention was made with government support under HR0011-16-C-0025 awarded by the DOD/DARPA and N00014-16-1-2995 awarded by the NAVY/ONR. The government has certain rights in the invention.

CROSS-REFERENCE TO RELATED APPLICATIONS

N/A

BACKGROUND

While the human eye has a unique ability to adapt to a wide range of brightness levels ranging from a bright sunny day down to single photon levels, conventional image sensors, such as complementary metal-oxide semiconductor (CMOS) and charge-coupled device (CCD) array image sensors (note that CMOS and CCD pixels are sometimes referred to herein as conventional pixels, and an array of such conventional pixels is sometimes referred to herein as a conventional image sensor), convert incident light into an electrical signal proportional to the brightness of the scene point up to a saturation point. This conversion process in conventional image sensors cannot simultaneously capture very dark and very bright regions that occur in many natural scenes. These limitations are often apparent in images of scenes captured using consumer products such as digital cameras incorporated into smartphones. However, these limitations can have additional effects in more specialized applications. For example, a vision sensor used in an autonomous vehicle driving at night may encounter scenes that include bright light sources (e.g., headlights of oncoming vehicles) while the rest of the scene remains relatively dark. As another example, an industrial robot using a machine vision system to assemble metallic machine parts may capture images that include strong specular highlights and shadows on the metallic parts which may exceed the relatively low dynamic range of many conventional image sensors. As yet another example, an image sensor used for microscope imaging may capture an image of a back-lit sample with high contrast, which may exceed the dynamic range of a conventional image sensor. In such examples, bright regions in the scene can cause conventional sensor pixels to saturate, whereas dark regions of the scene can be dominated by noise.

One approach to increasing dynamic range in conventional image sensors is to capture more light from darker parts of a scene to average out sensor noise, and capture less light from brighter parts of the scene to avoid saturation. A common computational technique called exposure bracketing uses multiple images of the scene captured using different exposure times, and blends the pixel values to generate a high dynamic range (HDR) image. This technique works relatively well for static scenes, but suffers from ghosting artifacts when capturing dynamic scenes that contain relatively fast-moving objects. Single-shot HDR sensors were developed in part to avoid these artifacts, and requires changing the image sensor hardware to include optical elements that modulate the amount of light reaching the sensor pixels. For example, some single-shot HDR sensors use fixed or adaptive light absorbing neutral density filters placed in front of the sensor pixels to spatially vary the amount of light received during a fixed exposure time. As another example, some single-shot HDR sensors use beamsplitters to relay the scene onto multiple imaging sensors with different exposure settings.

Other HDR imaging approaches involve redesigning the sensor pixel hardware to obtain a non-linear relationship between scene radiance (sometimes also referred to herein as brightness) and sensor output. For example, logarithmic image sensors use additional hardware in each pixel that applies logarithmic non-linearity to obtain dynamic range compression. While the approaches described above provide greater dynamic range than conventional image sensors, the dynamic range that can be achieved is limited by the hard saturation limit of the pixels.

Quanta image sensors (QIS) are a relatively new approach to HDR imaging that attempt to improve dynamic range through spatial oversampling. These QIS sensors exploit fine-grained (i.e., sub-diffraction-limit) spatial statistics to improve dynamic range. A QIS array is constructed with millions of pixels of sub-diffraction limit sizes, with each pixel being a binary sensor with negligible read noise. This enables designing a response function that mimics a silver-halide photographic plate with a logarithmic response curve that provides some overexposure latitude and avoids a hard saturation limit. However, gains in dynamic range using QIS techniques have been limited due to difficulties in manufacturing pixels smaller than about a micron in size. As discussed below in connection with FIG. 16, to achieve very high dynamic range using a QIS sensor, pixel size would need to be reduced by at least an order of magnitude (e.g., to at most 100 nm) which is not feasible using current technology.

Accordingly, new systems, methods, and media for high dynamic range imaging are desirable.

SUMMARY

In accordance with some embodiments of the disclosed subject matter, systems, methods, and media for high dynamic range imaging using dead-time-limited single photon detectors are provided.

In accordance with some embodiments of the disclosed subject matter, a system for high dynamic range imaging is provided, the system comprising: an image sensor comprising: a pixel comprising: a single photon detector configured to detect the arrival of a single photon, and having a dead time $\tau_d$ after detection of a photon; and a counter coupled to an output of the single photon detector, wherein the counter is configured to increment in response to a signal indicative of detection of a photon output by the single photon detector; and a processor that is programmed to: read out, from the pixel, a value stored by the counter after an exposure time has elapsed; and calculate an intensity value for the pixel based on the value and the dead time $\tau_d$.

In some embodiments, the pixel further comprises: a fast timing circuit coupled to the output of the single photon detector and configured to output a value indicative of a time at which a signal indicative of detection of a photon is output by the single photon detector; a first register coupled to an output of the fast timing circuit, wherein the first register is configured to store a value indicative of a time at which a first signal indicative of detection of a photon was output by the single photon detector during the exposure time; and a second register coupled to the output of the fast timing circuit, wherein the second register is configured to store a value indicative of a time at which a last signal indicative of detection of a photon was output by the single photon detector during the exposure time.

In some embodiments, the processor is further programmed to: read out, from the pixel, a first time from the first register; read out, from the pixel, a second time from the second register; and calculate an average time between signals indicative of detection of a photon based on the first time, the second time, and the value.

In some embodiments, the processor is further programmed to: calculate an estimated photon flux $\hat{\Phi}$ based on the relationship $$\hat{\Phi} = \frac{1}{q}\left(\frac{1}{(\overline{X} - \tau_d)}\right),$$

where q is the quantum efficiency of the SPAD, and $\overline{X}$ is the average time between signals indicative of detection of a photon output by the single photon detector.

In some embodiments, the fast timing circuit is a time-to-digital converter.

In some embodiments, the processor is further programmed to reset the counter at the beginning of the exposure time.

In some embodiments, the processor is further programmed to: calculate an estimated photon flux $\hat{\Phi}$ based on the relationship $$\hat{\Phi} = \frac{1}{q}\frac{N(T)}{T - N(T)\tau_d},$$

where q is the quantum efficiency of the single photon detector, T is the exposure time, and N(T) is the value read from the counter.

In some embodiments, the single photon detector comprises a single photon avalanche diode.

In some embodiments, the image sensor further comprises a plurality of pixels, each of the plurality of pixels comprising a single photon detector and a counter, and the processor is further programmed to generate image data based on calculated intensity values associated with each of the plurality of pixels and the intensity value associated with the pixel.

In some embodiments, the image sensor further comprises a plurality of CMOS pixels, and wherein the pixel is adjacent to at least three CMOS pixels of the plurality of CMOS pixels, and the processor is further programmed to generate image data based on calculated intensity values associated with at least a subset of the plurality of CMOS pixels and the intensity value associated with the pixel.

In accordance with some embodiments of the disclosed subject matter, a method for high dynamic range imaging using an image sensor comprising a pixel, the pixel comprising a single photon detector configured to detect the arrival of a single photon, and having a dead time $\tau_d$ after detection of the photon, and a counter coupled to an output of the single photon detector, wherein the counter is configured to increment in response to a signal indicative of detection of a photon output by the single photon detector is provided, the method comprising: reading out, from the pixel, a value stored by the counter after an exposure time has elapsed; and calculating an intensity value for the pixel based on the value and the dead time $\tau_d$.

In some embodiments, the pixel further comprises a fast timing circuit configured to output a value indicative of a time at which a signal indicative of detection of a photon is output by the single photon detector, a first register, and a second register, the method further comprising: receiving, at the fast timing circuit, an output from the single photon detector indicative of detection of a photon; in response to receiving the output from the single photon detector indicative of detection of a photon, outputting a value indicative of a current time from the fast timing circuit to the first register and the second register; recording, using the first register, a value indicative of a time at which a first signal indicative of detection of a photon was output by the single photon detector; and recording, using the second register, a value indicative of a time at which a last signal indicative of detection of a photon was output by the single photon detector.

In some embodiments, the method further comprises: reading out, from the pixel, a first time from the first register; reading out, from the pixel, a second time from the second register; and calculating, for each of the plurality of pixels, an average time between signals indicative of detection of a photon based on the first time, the second time, and the value.

In some embodiments, the method further comprises calculating an estimated photon flux $\hat{\Phi}$ based on the relationship $$\hat{\Phi} = \frac{1}{q}\left(\frac{1}{(\overline{X} - \tau_d)}\right),$$

where q is the quantum efficiency of the SPAD, and $\overline{X}$ is the average time between signals indicative of detection of a photon output by the single photon detector.

In some embodiments, the method further comprises resetting the counter at the beginning of the exposure time.

In some embodiments, the method further comprises calculating an estimated photon flux $\hat{\Phi}$ based on the relationship $$\hat{\Phi} = \frac{1}{q}\frac{N(T)}{T - N(T)\tau_d},$$

where q is me quantum efficiency of the single photon detector, T is the exposure time, and N(T) is the value output from the counter.

In some embodiments, the image sensor further comprises a plurality of pixels, each of the plurality of pixels comprising a single photon detector and a counter, and the method further comprises generating image data based on calculated intensity values associated with each of the plurality of pixels and the intensity value associated with the pixel.

In accordance with some embodiments of the disclosed subject matter, a non-transitory computer readable medium containing computer executable instructions that, when executed by a processor, cause the processor to perform a method for high dynamic range imaging using an image sensor comprising a pixel, the pixel comprising a single photon detector configured to detect the arrival of a single photon, and having a dead time $\tau_d$, and a counter coupled to an output of the single photon detector, wherein the counter is configured to increment in response to a signal indicative of detection of a photon output by the single photon detector, the method comprising: reading out, from the pixel, a value stored by the counter after an exposure time has elapsed; and calculating an intensity value for the pixel based on the value and the dead time $\tau_d$.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements.

FIG. 17A shows an example of a low dynamic range image of a scene using a conventional CMOS image sensor exposed for a first amount of time.

FIG. 17B shows an example of a low dynamic range image of the scene using a conventional CMOS image sensor exposed for a second amount of time.

FIG. 17C shows an example of a high dynamic range image of the scene using a single photon avalanche diode detector image sensor implemented in accordance with some embodiments of the disclosed subject matter for the first amount of time.

FIG. 18A shows an example of the measured illuminance in various portions of a second scene.

FIG. 18B shows an example of a low dynamic range image of the second scene using a conventional CMOS image sensor exposed for a first amount of time.

FIG. 18C shows an example of a low dynamic range image of the second scene using a conventional CMOS image sensor exposed for a second amount of time.

FIG. 18D shows an example of a high dynamic range image of the second scene using a single photon avalanche diode detector image sensor implemented in accordance with some embodiments of the disclosed subject matter for the first amount of time.

DETAILED DESCRIPTION

Figure 1:
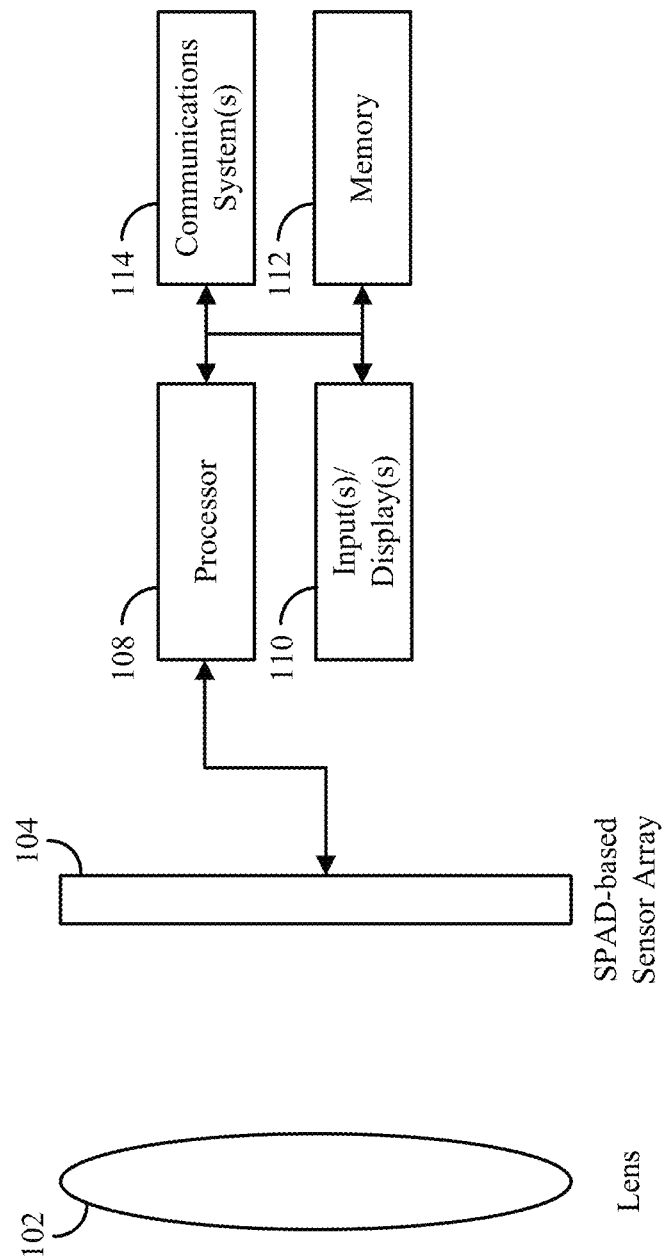
FIG. 1 shows an example of a system for high dynamic range imaging using dead-time-limited single photon detectors in accordance with some embodiments of the disclosed subject matter.

In accordance with various embodiments, mechanisms (which can, for example, include systems, methods, and media) for high dynamic range imaging using dead-time-limited single photon detectors are provided.

In some embodiments, the mechanism described herein can capture single-shot high dynamic range images using time-resolved single photon-counting detectors. Unlike conventional pixels, a single photon avalanche diode (SPAD) has the ability to count individual photons, which is taken advantage of in active imaging applications such as LiDAR and non-line of sight imaging systems, and for imaging under extremely low light levels. In contrast to this traditional use case, the mechanisms described herein uses SPADs as general purpose imaging sensors under ambient lighting conditions. As described below, a SPAD-based image sensor can improve dynamic range by many orders of magnitude compared to conventional sensors. Note that although the mechanisms described herein are generally described with reference to SPADs, this is merely a particular example of a dead-time-limited single photon detector, and the mechanisms described herein can be used in connection with other dead-time-limited single photon detectors.

Like other avalanche photodiodes, SPADs operate on the principle of impact ionization. A reverse bias voltage much higher than the breakdown voltage provides very high avalanche multiplication gain and gives SPADs the ability to count and time-tag individual photons with very low jitter. After each photon detection avalanche event, the SPAD is quenched to remove the charged carriers produced during the avalanche from the PN junction. The SPAD remains off during this "dead time" and cannot count additional photons. Conventional image sensor pixels suffer from a hard saturation limit (sometimes referred to as the "full well capacity") which prevents them from counting any photons for the remainder of the exposure time after the saturation level is reached.

The mechanisms described herein can use a SPAD pixel as a temporal binary sensor which divides the total exposure time into random non-equispaced intervals where each time interval is at least as long as the dead time. Unlike conventional pixels that have a hard saturation limit, a SPAD pixel with an exposure time of T and dead time $\tau_d$ has an asymptotic saturation limit given by $$\left\lfloor \frac{T}{\tau_d} \right\rfloor.$$

In theory, this limit can only be achieved with an infinitely bright light source. Note that the output response of a SPAD pixel is non-linear as a function of incident photon flux, which is a result of the inability of a SPAD to detect photon events during its dead time. This provides brightness-dependent gain resulting in a response curve that saturates very slowly as described below in connection with FIG. 5, which has some superficial similarities to a tone-mapping curve used in some HDR imaging techniques. Due to the non-linear response curve, the SPAD provides dynamic range compression, with no additional hardware modifications.

FIG. 1 shows an example 100 of a system for high dynamic range imaging using dead-time-limited single photon detectors in accordance with some embodiments of the disclosed subject matter. As shown, system 100 can include a lens 102; an image sensor 104 (e.g., an area sensor that includes an array of detectors); a processor 108 for controlling operations of system 100 which can include any suitable hardware processor (which can be a central processing unit (CPU), a digital signal processor (DSP), a microcontroller (MCU), a graphics processing unit (GPU), etc.) or combination of hardware processors; an input device/display 110 (such as a shutter button, a menu button, a microphone, a touchscreen, a motion sensor, a liquid crystal display, a light emitting diode display, etc., or any suitable combination thereof) for accepting input from a user and/or from the environment, and/or for presenting information (e.g., images, user interfaces, etc.) for consumption by a user; memory 112; and a communication system or systems 114 for facilitating communication between system 100 and other devices, such as a smartphone, a wearable computer, a tablet computer, a laptop computer, a personal computer, a server, an embedded computer (e.g., for controlling an autonomous vehicle, robot, etc.), etc., via a communication link. In some embodiments, memory 112 can store image data and/or any other suitable data. Memory 112 can include a storage device (e.g., a hard disk, a Blu-ray disc, a Digital Video Disk, RAM, ROM, EEPROM, etc.) for storing a computer program for controlling processor 108. In some embodiments, memory 112 can include instructions for causing processor 108 to execute processes associated with the mechanisms described herein, such as processes described below in connection with FIGS. 10 and 11.

In some embodiments, image sensor 104 can be an image sensor that is implemented at least in part using one or more single photon avalanche diode (SPAD) detectors (sometimes referred to as a Geiger-mode avalanche diode) that can generate data indicative of brightness of the scene via lens 102. For example, in some embodiments, image sensor 104 can be an array of SPAD detectors. As another example, image sensor 104 can be a hybrid array including one or more SPAD detectors and one or more conventional light detectors (e.g., CMOS-based pixels). In some embodiments, image sensor 104 can be a monochrome image sensor or a color image. In some embodiments, system 100 can include additional optics. For example, although lens 102 is shown as a single lens, it can be implemented as a compound lens or combination of lenses. Note that although the mechanisms described herein are generally described as using SPAD-based pixels (e.g., as described below in connection with FIG. 2), this is merely an example of a single photon detector with a dead time after a detection, and other components can be used in place of SPAD detectors. For example, a photomultiplier tube in Geiger mode can be used to detect single photon arrivals.

In some embodiments, system 100 can communicate with a remote device over a network using communication system(s) 114 and a communication link. Additionally or alternatively, system 100 can be included as part of another device, such as a smartphone, a tablet computer, a laptop computer, an autonomous vehicle, a robot, etc. Parts of system 100 can be shared with a device within which system 100 is integrated. For example, if system 100 is integrated with a smartphone, processor 108 can be a processor of the smartphone and can be used to control operation of system 100.

In some embodiments, system 100 can communicate with any other suitable device, where the other device can be one of a general purpose device such as a computer or a special purpose device such as a client, a server, etc. Any of these general or special purpose devices can include any suitable components such as a hardware processor (which can be a microprocessor, digital signal processor, a controller, etc.), memory, communication interfaces, display controllers, input devices, etc. For example, the other device can be implemented as a digital camera, security camera, outdoor monitoring system, a smartphone, a wearable computer, a tablet computer, a personal data assistant (PDA), a personal computer, a laptop computer, a multimedia terminal, a game console, a peripheral for a game counsel or any of the above devices, a special purpose device, etc.

Communications by communication system 114 via a communication link can be carried out using any suitable computer network, or any suitable combination of networks, including the Internet, an intranet, a wide-area network (WAN), a local-area network (LAN), a wireless network, a digital subscriber line (DSL) network, a frame relay network, an asynchronous transfer mode (ATM) network, a virtual private network (VPN). The communications link can include any communication links suitable for communicating data between system 100 and another device, such as a network link, a dial-up link, a wireless link, a hard-wired link, any other suitable communication link, or any suitable combination of such links.

It should also be noted that data received through the communication link or any other communication link(s) can be received from any suitable source. In some embodiments, processor 108 can send and receive data through the communication link or any other communication link(s) using, for example, a transmitter, receiver, transmitter/receiver, transceiver, or any other suitable communication device.

Figure 2:
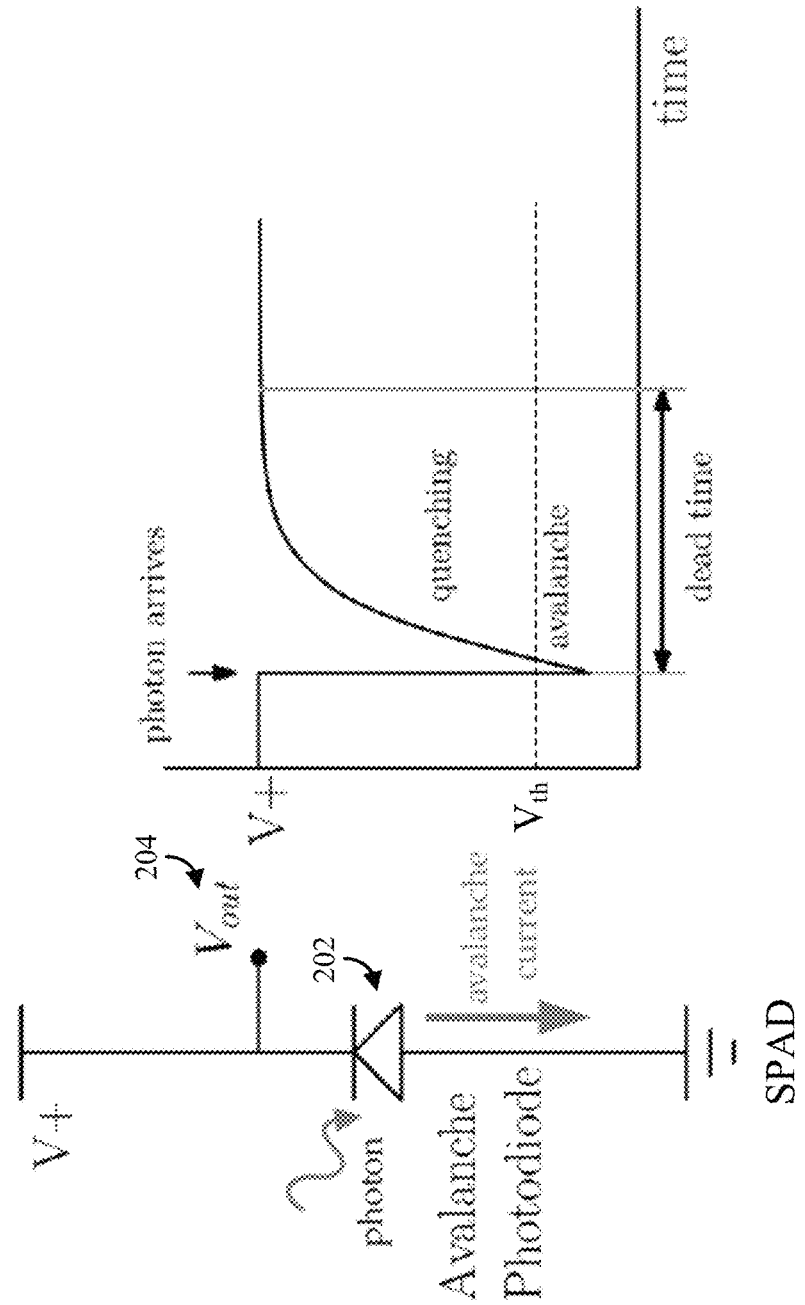
FIG. 2 shows an example implementation of a single photon avalanche diode that can be used in the image sensor of FIG. 1 and a diagram showing voltage over time when a photon impinges the diode.

FIG. 2 shows an example 200 implementation of a SPAD that can be used in the image sensor of FIG. 1 and a diagram showing voltage over time when a photon impinges the diode. As shown in FIG. 2, the SPAD can include a diode 202 with a relatively high bias voltage (+V) (i.e., a bias voltage that is higher than the breakdown voltage of diode 202) applied to the cathode with the anode coupled to ground. In some embodiments, bias voltage +V can be set such that when a single photon is received by diode 202 breakdown occurs, causing a relatively large decrease in voltage at an output node 204. As described below, in some embodiments, output node 204 can be coupled to a circuit for detecting that breakdown has occurred, which can be used to determine when a photon is received by diode 202. For example, output node 204 can be connected to a component or components (e.g., via an input to a counter, via an input to a latch, via a gate of a field effect transistor, via an input of a comparator, etc.), configured to change state when the voltage drops below a threshold voltage ($V_{th}$). In some embodiments, one or more components can be disposed between the bias voltage +V and the cathode of diode 202. For example, a passive quenching circuit (which can, in some cases, simply be a resistor) can be connected between bias voltage +V and the cathode of diode 202. As another example, one or more components of an active quenching circuit and/or gate (e.g., for controlling an operative state of the SPAD detector). In a more particular example, an active quenching circuit described in Buttafava et al., "Time-gated single-photon detection module with 110 ps transition time and up to 80 MHz repetition rate," Rev. Sci. Instrum. (2014), which is hereby incorporated by reference herein in its entirety.

In some embodiments, after breakdown occurs with arrival of the photon, a quenching operation is performed by a quenching circuit, which can be an active quenching circuit, a passive quenching circuit, a passive quenching active reset circuit, or any other suitable quenching circuit. The quenching circuit can return the voltage at the cathode to the initial bias voltage such that another photon detection can occur. The time during which quenching occurs is sometimes referred to as the dead time of the SPAD.

In some embodiments, the dead time of the SPAD can be controlled by the quenching circuit such that an avalanche does not occur until the voltage at the cathode has reached bias voltage +V. Additionally, in some embodiments, a gate can be associated with the SPAD to control the length of the dead time beyond the time required to return the cathode to bias voltage +V. For example, a switch can be placed between output node 204 and a detection component.

In some embodiments, diode 202 can be associated with another Geiger mode avalanche diode (not shown) that is shielded from receiving light, and a detection component can be configured such that a detection is recorded when diode 202 appears to have detected a photon, and the associated shielded diode does not detect a photon. This can reduce the number of detections attributed to noise that causes both diode 202 and the shielded Geiger mode avalanche diode to both fall below the threshold.

Figure 3:
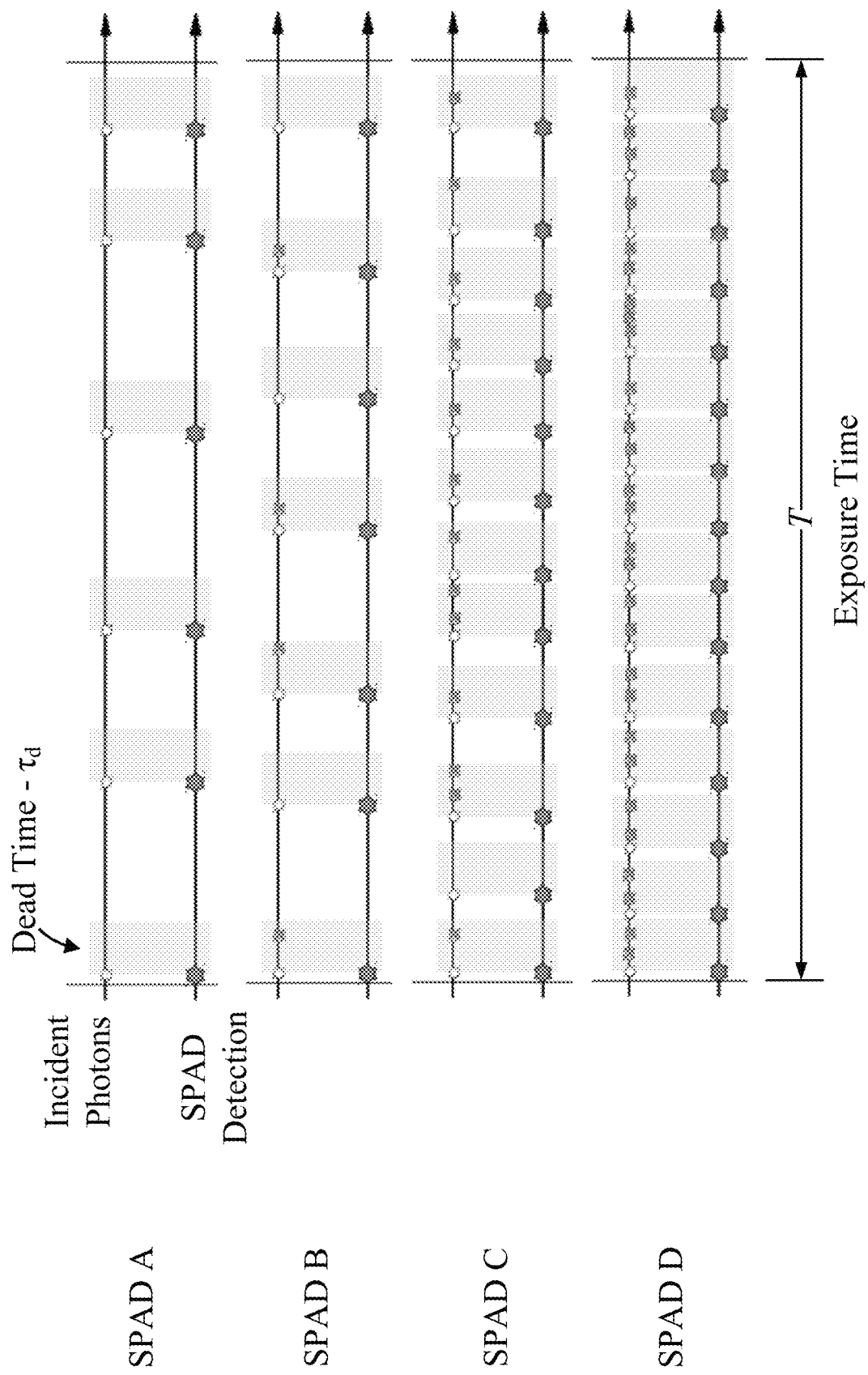
FIG. 3 shows an example of a diagram including photon arrivals, single photon avalanche diode detections, and subsequent single photon avalanche diode dead times following detections that can be used to generate high dynamic range image data in accordance with some embodiments of the disclosed subject matter.

FIG. 3 shows an example of a diagram including photon arrivals, single photon avalanche diode detections, and subsequent single photon avalanche diode dead times following detections that can be used to generate high dynamic range image data in accordance with some embodiments of the disclosed subject matter. As shown in FIG. 3, four different SPADs are shown that are exposed to varying numbers of photons within an exposure time T. SPAD A is exposed to a photon flux that is low enough that each photon that is incident on SPAD A causes a SPAD detection, such that the time between the end of each dead time ($\tau_d$) and the next detection is relatively long. SPAD B is exposed to a higher photon flux such that a minority of photons that are incident on SPAD B arrive during the dead time, but a large majority of photons are incident such that are detection occurs. SPAD C is exposed to a yet higher photon flux such that about half of the photons that are incident on SPAD C arrive during the dead time. SPAD D is exposed to an even higher photon flux such that the majority (e.g., about two-thirds) of the photons that are incident on SPAD D arrive during the dead time. As shown in FIG. 3, as the photon flux incident at the SPAD increases, the average length of time between the end of the dead time for a previous SPAD detection and a next SPAD detection decreases.

More particularly, suppose a SPAD pixel observes a radiant flux of $\Phi$ photons per unit time and captures N(T) photons with inter arrival times $\{X_1, X_2, \ldots, X_{N(T)-1}\}$ over an exposure time of T. Due the dead time, the true photon flux from SPAD photon count data can be estimated using an inverse non-linear mapping that relates the average time of darkness between the captured photons with the photon flux, which can be represented as:

$$\hat{\Phi} = \frac{1}{q}\left(\frac{1}{(\overline{X} - \tau_d)}\right), \tag{1}$$

where $$\overline{X} = \frac{1}{N(T)-1} \sum_{i=1}^{N(T)-1} X_i$$

is the mean time between detections and $0<q<1$ is the photon detection probability of the SPAD pixel (sometimes referred to as the quantum efficiency of the SPAD pixel), and $X_i$ is the time between a pair of successive detections (e.g., $X_1$ is the time between the first and second detections, $X_2$ is the time between the second and third detections, etc., and $X_{N(T)-1}$ is the time between the penultimate and last detections within exposure time T).

In some embodiments, a SPAD detector system can use one or more fast counting circuits that provide a count N(T) of the total detection events in the exposure time interval T. The mean time between detections can then be approximately written as $$\frac{T}{N(T)},$$

and an approximation to EQ. (1) can be used, which can be represented as:

$$\hat{\Phi} = \frac{1}{q} \frac{N(T)}{T - N(T)\tau_d} \tag{2}$$

As described above, shot noise is caused by the random arrival time of photons at the sensor due to quantum effects, which imposes a fundamental limit on how accurately a sensor can measure scene brightness. In addition to shot noise, other sources of noise in a SPAD pixel include dark counts and after pulsing noise that can cause a bias in the estimated flux. Dark counts are avalanches caused by thermally generated electrons, rather than photons, and can be modeled as a Poisson process which is independent of the photon arrivals. Afterpulsing noise is spurious avalanches caused due to charged carriers from past avalanches that remain trapped in the PN junction of the SPAD, setting off another avalanche. These sources of noise can cause the estimated photon flux to deviate from the true value, and the deviation can be quantified using the root-mean-squared error (RMSE) metric:

$$\text{RMSE}(\hat{\Phi}) = \sqrt{E[(\hat{\Phi} - \Phi)^2]}$$

where the expectation operation averages over all the different sources of noise in the sensor. Signal-to-noise ratio (SNR) can be defined as the ratio of the true photon flux to the RMSE of the estimate, and can be represented as:

$$SNR(\Phi) = 20 \log_{10}\left(\frac{\Phi}{RMSE(\hat{\Phi})}\right) \quad (3)$$

Using the bias-variance decomposition, the mean-squared error of the estimate $\hat{\Phi}$ in EQ. (2) can be expressed as a sum of individual noise terms as:

$$E[(\hat{\Phi} - \Phi)^2] = \left(\underbrace{\frac{\Phi_{dark}}{\Phi}}_{\text{dark count bias}} + \underbrace{q\Phi(1 + \Phi\tau_d)P_{ap}e^{-q\Phi\tau_d}}_{\text{afterpulsing bias}}\right)^2 + \underbrace{\frac{\Phi(1 + q\Phi\tau_d)}{qT}}_{\text{shot noise variance}} + \underbrace{\frac{(1 + q\Phi\tau_d)^4}{12q^2T^2}}_{\text{quantization variance}} \quad (4)$$

where $P_{ap}$ is the after pulsing probability. Using this representation and EQ. (3), SNR of a SPAD pixel implemented in accordance with some embodiments of the disclosed subject matter can be represented as:

$$SNR(\Phi) = -10 \log_{10}\left[\left(\frac{\Phi_{dark}}{\Phi} + q(1 + \Phi\tau_d)P_{ap}e^{-q\Phi\tau_d}\right)^2 + \frac{1 + q\Phi\tau_d}{q\Phi T} + \frac{(1 + q\Phi\tau_d)^4}{12q^2\Phi^2 T^2}\right] \quad (5)$$

Dynamic range (DR) of a SPAD pixel can be defined as the ratio of largest to smallest photon flux values for which the SPAD pixel operates at or above a specified minimum SNR of $SNR_{min}$:

$$DR = \frac{\sup_\Phi\{\Phi : SNR(\Phi) \geq SNR_{min}\}}{\inf_\Phi\{\Phi : SNR(\Phi) \geq SNR_{min}\}}$$

Figure 4:
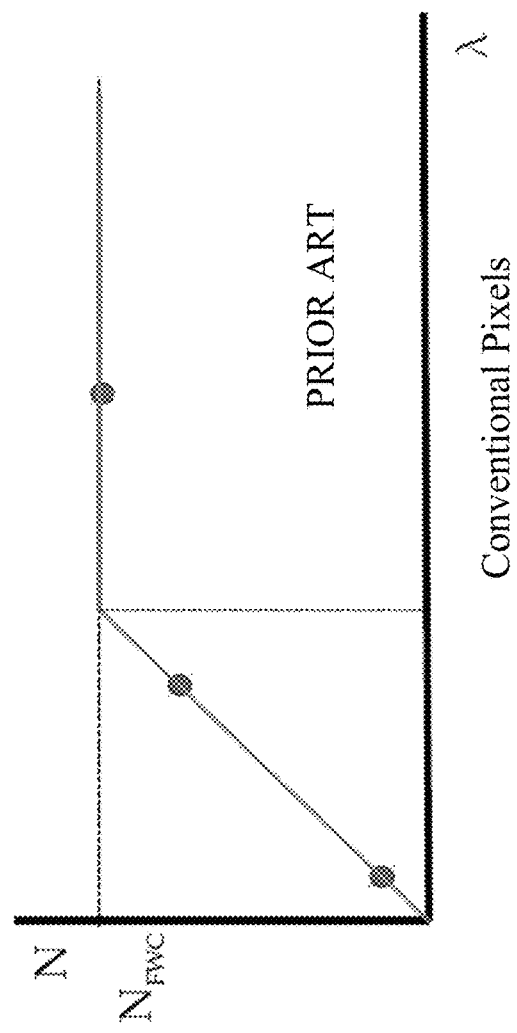
FIG. 4 shows an example of a response curve of a conventional light detector.

FIG. 4 shows an example of a response curve of a conventional light detector. As shown in FIG. 4, which depicts the response curve of a linear conventional pixel, as the number of incident photons per unit time ($\lambda$) increases, the number of photons detected (N) increases linearly until the full well capacity ($N_{FWC}$) of the sensor is reached, after which the number of photons detected no longer increases. When the full well capacity is reached, the pixel is saturated, and the true photon flux of the scene cannot be accurately recovered.

Figure 5:
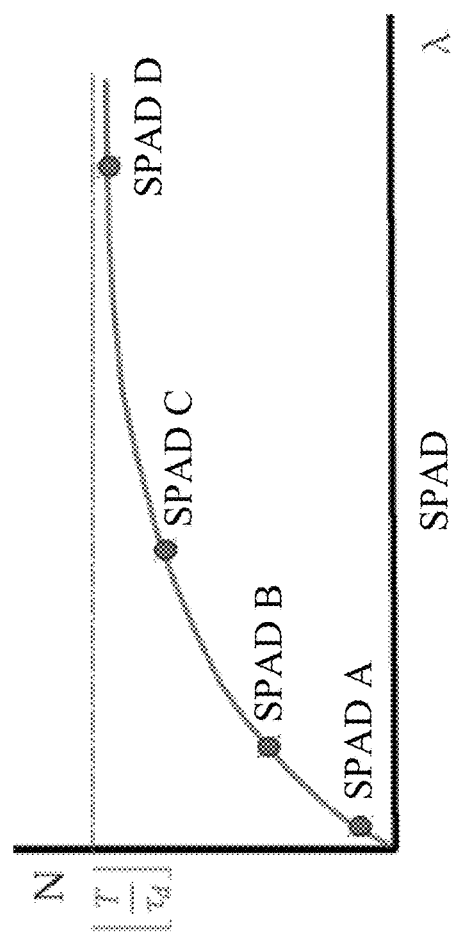
FIG. 5 shows an example of a response curve of a single photon avalanche diode detector that can be used to generate high dynamic range image data in accordance with some embodiments of the disclosed subject matter.

FIG. 5 shows an example of a response curve of a single photon avalanche diode detector that can be used to generate high dynamic range image data in accordance with some embodiments of the disclosed subject matter. As shown in FIG. 5, as the number of incident photons per unit time ($\lambda$) increases, the number of photons detected (N) increases non-linear and asymptotically approaches a count equal to the exposure time over the dead time (i.e., $T/\tau_d$). Note that, as described above in connection with FIG. 3, because the number of photons that are detected are a decreasing fraction of the total photons that are incident on the SPAD pixel, the measured photons can be used to estimate the actual photon flux incident at the SPAD pixel. As described above in connection with EQ. (2), the photon flux can be approximated based on the number of photons detected (N), the total exposure time (T), and the dead time ($\tau_d$). As can be appreciated in comparing FIGS. 4 and 5, the non-linear response of the SPAD pixel vastly increases the dynamic range as compared to the conventional pixel without capturing multiple images (e.g., by exposure bracketing), or adjusting the exposure to account for different light levels (e.g., through spatially varying exposure).

Figure 6:
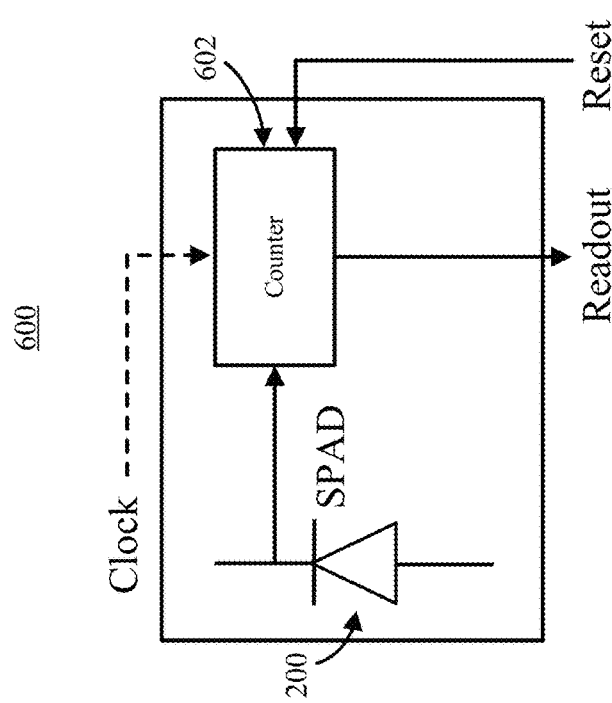
FIG. 6 shows an example of a single photon avalanche diode pixel that can be used to generate high dynamic range image data in accordance with some embodiments of the disclosed subject matter.

FIG. 6 shows an example 600 of a single photon avalanche diode pixel that can be used to generate high dynamic range image data in accordance with some embodiments of the disclosed subject matter. As shown in FIG. 6, SPAD pixel 600 can include a SPAD detector (e.g., as SPAD detector 200 described above in connection with FIG. 2), which can be implemented using CMOS techniques, and can include an active or passive quenching circuit to quench avalanche pulses. Additionally, in some embodiments, SPAD pixel 600 can include a digital accumulator 602 that increments a counter with each avalanche pulse.

As shown in FIG. 6, counter 602 can be coupled to a readout (e.g., a digital bus, a digital serial communication link, etc.) that can be used to read the final count of avalanches that were detected during an exposure time. Additionally, in some embodiments, counter 602 can be coupled to a reset line that can be used to apply a reset signal such that the count is initialized for the beginning of the exposure time.

In some embodiments, SPAD pixel 600 can be used to implement an image sensor by arranging SPAD pixels 600 in an array with a resolution sufficient to generate an image (e.g., either using entirely SPAD pixels, or alternatively using a combination of both conventional pixels and SPAD pixels). In such embodiments, a shutter can be implemented using the reset lines associated with each counter 602 and/or a gate that controls operation of SPAD detector 200. For example, when an image is to be generated, each counter 602 associated with each SPAD pixel can be reset to an initial value at the beginning of the exposure time (e.g., t=0), and the value of counter 602 can be read out at the end of the exposure time (e.g., t=T). The value read from each counter 602 can then be used to calculate the brightness at each SPAD pixel in the array (e.g., using techniques described above in connection with FIGS. 2 and 3). In some embodiments, counter 602 can operate based on an external clock signal. Alternatively, in some embodiments, counter 602 operate based on an included internal clock.

In some embodiments, a global shutter can be used to expose all SPAD pixels 600 simultaneously. For example, the reset signal can be applied to all counters 602 at the same time to begin the exposure time for the entire array of SPAD pixels 600. As another example, a switch that controls operation of SPAD detector 200 of pixels 600 can be operated to enable functioning of SPAD pixels 600 (e.g., by connecting SPAD detector 200 to a bias voltage, by completing a connection between an output of SPAD detector 200 and counter 602, etc.).

Alternatively, in some embodiments, SPAD pixels 600 can be exposed using a non-global shutter technique, such as a rolling shutter (e.g., in which the exposure time of each row is started in a staggered manner), an interlaced shutter (e.g., in which odd rows are exposed during a first time, and even rows are exposed during a second time), individually addressed shuttering, etc.

Figure 7:
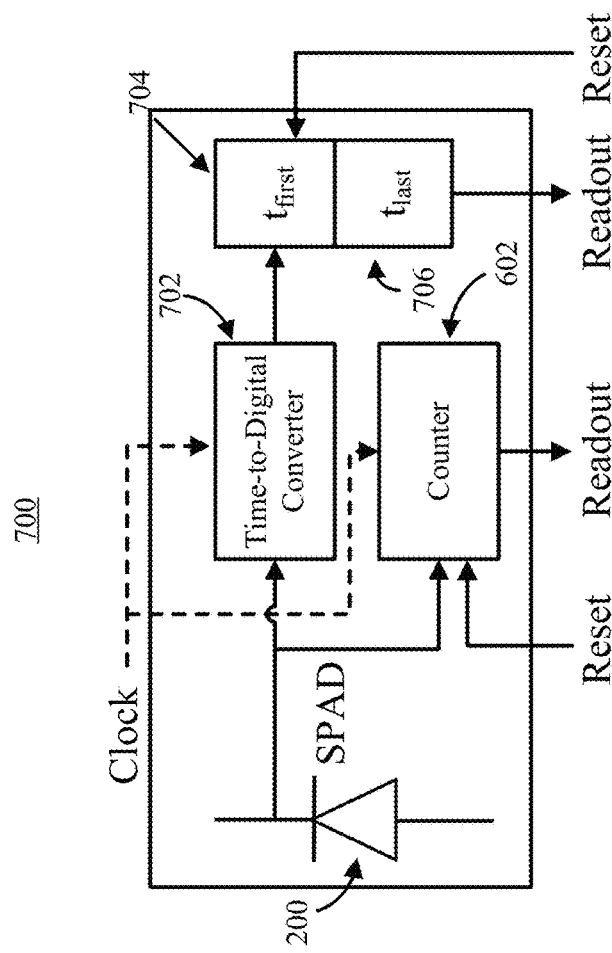
FIG. 7 shows another example of a single photon avalanche diode pixel that can be used to generate high dynamic range image data in accordance with some embodiments of the disclosed subject matter.

FIG. 7 shows another example of a single photon avalanche diode pixel that can be used to generate high dynamic range image data in accordance with some embodiments of the disclosed subject matter. As shown in FIG. 7, SPAD pixel 700 can include a SPAD detector (e.g., as SPAD detector 200 described above in connection with FIG. 2), which can be implemented using CMOS techniques, and can include an active or passive quenching circuit to quench avalanche pulses. Additionally, in some embodiments, SPAD pixel 700 can include a digital accumulator 602 that increments a counter with each avalanche pulse, a time to digital converter (TDC) 702, a first register 704 that can be configured to store the time at which a first SPAD detection occurred during an exposure time, and a second register 706 that can be configured to store the time at which a most recent SPAD detection occurred during the exposure time. In some embodiments, TDC 702 can operate based on an internal clock, which can also, in some cases, be used to generate time values when an event is recorded. In such embodiments, an internal clock signal from of TDC 702 can be provided to counter 602, and counter 602 can operate based on the clock signal received from TDC 702 (not shown). Additionally or alternatively, in some embodiments, TDC 702 and/or counter 602 can operate based on an external clock signal. Note that although TDC 702 is described as a component configured to output a value indicative of a time when an event is detected, this is merely an example, and other fast timing circuits can be used to output a value indicative of a time when a photon was detected, such as a time-to-analog converter (TAC), which can, in some embodiments, be used in combination with an analog to digital converter to output a digital value indicative of a time when a photon was detected. Note also, that in some embodiments, registers 704 and/or 706 can be replaced with one or more components configured to store an analog value (e.g., output by a TAC) indicative of a time when a photon was detected.

As shown in FIG. 7, each of counter 602, register 704, and register 706 can be coupled to a readout (e.g., a digital bus, a digital serial communication link, etc.) that can be used to read the final count of avalanches that were detected during an exposure time, the time when the first avalanche was detected, and the time when the last (i.e., most recent) avalanche was detected. Additionally, in some embodiments, counter 602 and register 704 can be coupled to a reset line(s) that can be used to apply a reset signal such that the count and/or register is initialized for the beginning of the exposure time.

In some embodiments, when SPAD detector 200 detects a photon (or in some cases, when noise causes an avalanche), TDC 702 can output a digital representation of the time to registers 704 and 706. In some embodiments, register 704 can be configured to record the first value provided to the register, after which the register inhibits further received values from being recorded (e.g., until a reset signal is received). In such embodiments, register 704 can record the time at which a first avalanche occurred during a particular exposure time based on the first output of TDC 702.

In some embodiments, register 706 can be configured to record the most recent value provided to the register, after which the register accepts and records new values received from TDC 702. In such embodiments, by continually updating after each avalanche, register 706 can record the time at which a most recent avalanche occurred, and thus record the time when the last avalanche occurred regardless of when the last detection occurred with relation to the end of the exposure time. In some embodiments, registers 704 and/or 706 can be configured to store any suitable number of bits of information. For example, the number of bits can be based on the resolution at which time information is output from TDC 702. In such an example, if TDC 702 outputs a time value that is accurate on the order of picoseconds, each register can be implemented as a 4 or 5 byte register (i.e., a register that can store values represented by up to 32 bits or 40 bits respectively) for exposure times of 5 to 10 ms (e.g., for a TDC with a 4 ps bin resolution, a 4 byte register can store values for a 10 ms exposure time).

In some embodiments, the number of photons incident on SPAD 700 during the exposure time can be determined based on the time when the first detection occurred (e.g., when the first photon was incident on SPAD detector 200), the time when the last detection occurred (e.g., when the last photon was incident on SPAD detector 200 prior to the end of the exposure time), the dead time, and the number of detections that occurred.

In some embodiments, SPAD pixel 700 can be used to implement an image sensor by arranging SPAD pixels 700 in an array with a resolution sufficient to generate an image (e.g., either using entirely SPAD pixels, or alternatively using a combination of both conventional pixels and SPAD pixels). In such embodiments, a shutter can be implemented using the reset lines associated with each counter 702, register 704, and/or a gate that controls operation of SPAD detector 200. For example, when an image is to be generated, each counter 702 associated with each SPAD pixel can be reset to an initial value at the beginning of the exposure time (e.g., t=0), and the value of counter 702, register 704, and register 706 can be read out at the end of the exposure time (e.g., t=T). The value read from each counter 702, register 704, and register 706 can then be used to calculate the brightness at each SPAD pixel in the array (e.g., using techniques described above in connection with FIGS. 2 and 3).

In some embodiments, a global shutter can be used to expose all SPAD pixels 700 simultaneously. For example, the reset signal can be applied to all counters 702 and registers 704 at the same time to begin the exposure time for the entire array of SPAD pixels 700. As another example, a switch that controls operation of SPAD detector 200 of pixels 700 can be operated to enable functioning of SPAD pixels 700 (e.g., by connecting SPAD detector 200 to a bias voltage, by completing a connection between an output of SPAD detector 200 and counter 702 and/or TDC 704, etc.).

Alternatively, in some embodiments, SPAD pixels 700 can be exposed using a non-global shutter technique, such as a rolling shutter (e.g., in which the exposure time of each row is started in a staggered manner), an interlaced shutter (e.g., in which odd rows are exposed during a first time, and even rows are exposed during a second time), individually addressed shuttering, etc.

Note that although a single SPAD detector is shown in the SPAD pixels described above in connection with FIGS. 6 and 7, in some embodiments, multiple SPAD detectors can share components, such as a counter, a TDC, one or more registers, etc. Additionally, in some embodiments, each time output by the TDC can be recorded (e.g., rather than recording only the first and last times during the exposure time), and the inter-photon arrival times can be calculated based on the recorded times. While this approach can generate large amounts of data, it can increase the accuracy of photon flux estimates. Accordingly, this approach can be especially well suited to applications in which photon flux is relatively low (e.g., which generates less photon arrival time data points), and in which sufficient memory can be provided. For example, astronomical imaging applications can be well suitable to such an approach.

Figure 8:
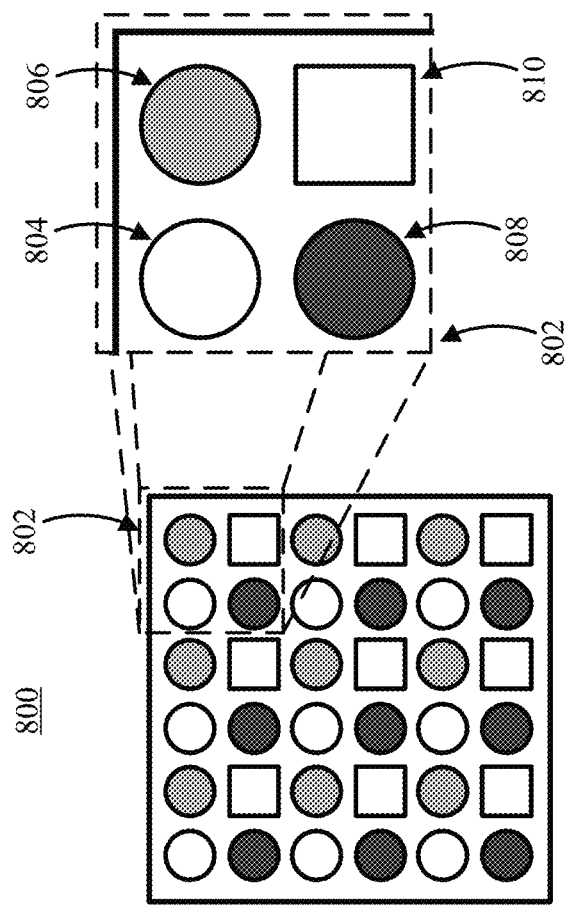
FIG. 8 shows an example hybrid image sensor that includes both conventional light detectors and single photon avalanche diode detectors in accordance with some embodiments of the disclosed subject matter.

FIG. 8 shows an example hybrid image sensor 800 that includes both conventional light detectors and single photon avalanche diode detectors in accordance with some embodiments of the disclosed subject matter. As shown in FIG. 8, image sensor 800 is a monochrome image sensor (i.e., not including individual color filters associated with one or more pixels) that includes both CMOS pixels (e.g., including reverse-biased photodiodes) and SPAD pixels (e.g., configured as described above in connection with SPAD pixel 600 of FIG. 6 and/or SPAD pixel 700 of FIG. 7). In some embodiments, pixels of image sensor 800 can be associated with a neutral density filter that reduces the amount of light that can be received by the pixel. For example, as shown in FIG. 8, pixels of image sensor 800 can be configured as a repeating pattern of a group 802 of four pixels that includes three CMOS pixels and one SPAD pixel. In such an example, each CMOS pixel can be associated with a different level of light transmittance (e.g., implemented using neutral density filters having different transmittance). In a more particular example, a first CMOS pixel 804 of group 802 can be associated with a filter having 100% transmittance in the visible spectrum (e.g., pixel 804 can be associated with an infrared (IR) filter such that IR light is not received by pixel 804). As another more particular example, a second CMOS pixel 806 of group 802 can be associated with a filter having lower than 100% transmittance in the visible spectrum (e.g., transmittance in the range of 50% to 75%) such that under uniform illumination less photons are received by pixel 806 than by pixel 804 during the same exposure time. As yet another more particular example, a third CMOS pixel 808 of group 802 can be associated with a filter having yet lower transmittance in the visible spectrum (e.g., transmittance in the range of 25% to 50%) such that less photons are received by pixel 808 than by either pixel 804 or pixel 806 when otherwise exposed to the same photon flux.

In some embodiments, group 802 can include a SPAD pixel 810 that can be associated with a filter having 100% transmittance in the visible spectrum. As described above, SPAD pixel 810 can be configured to have a much larger dynamic range than CMOS pixels 802-808, and accordingly can be used to estimate the photon flux received at SPAD pixel 810 regardless of the photon flux, whereas CMOS pixels 802-808 have more limited dynamic range. In some embodiments, for example as described below in connection with process 1100 of FIG. 11, the photon flux at SPAD sensor 810 (and/or SPAD sensors in nearby groups) can be calculated and used to adjust (e.g., to correct) the brightness value of nearby CMOS pixels (e.g., using one or more interpolation techniques). Additionally or alternatively, in some embodiments, SPAD pixel 810 can be used to determine brightness in the area of group 802 in cases in which the portion of the scene corresponding to group 802 is relatively dark or relatively bright in comparison to other portions of the scene (e.g., when the portion of the scene is outside of the dynamic range of one or more of pixels 804-808).

Figure 9:
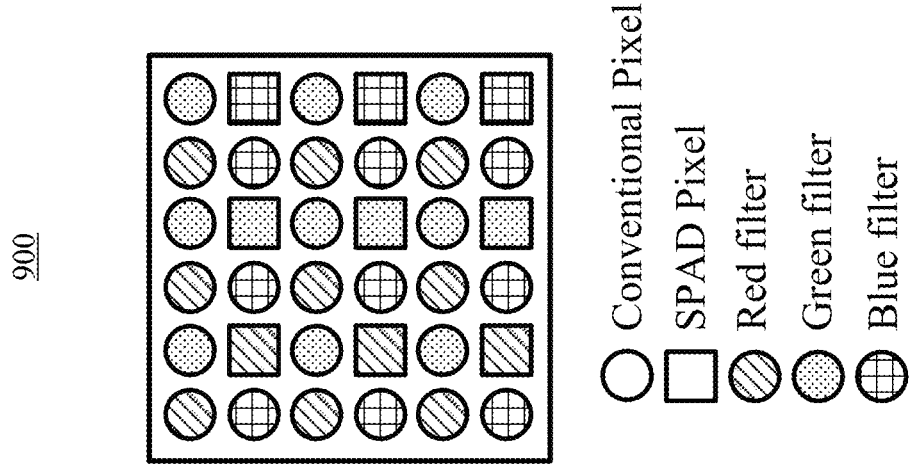
FIG. 9 shows another example hybrid image sensor that includes both conventional light detectors and single photon avalanche diode detectors in accordance with some embodiments of the disclosed subject matter.

FIG. 9 shows another example hybrid image sensor that includes both conventional light detectors and single photon avalanche diode detectors in accordance with some embodiments of the disclosed subject matter. As shown in FIG. 9, image sensor 900 includes both CMOS pixels (e.g., including reverse-biased photodiodes) and SPAD pixels (e.g., configured as described above in connection with SPAD pixel 600 of FIG. 6 and/or SPAD pixel 700 of FIG. 7) that are each associated with a color filter. In some embodiments, pixels of image sensor 900 can be associated with a color filter that reduces the amount of light that can be received by the pixel in certain wavelengths. For example, as shown in FIG. 9, pixels of image sensor 900 can be configured as a repeating pattern of four pixels that includes three CMOS pixels and one SPAD pixel. In such an example, each CMOS pixel can be associated with a different color filter, with each group having one red, one blue, and one green filter.

In some embodiments, each group can include a SPAD pixel that can be associated with a color filter that is the same as one of the CMOS pixels in the group, with the color of the SPAD pixel varying across image sensor 900 as shown in FIG. 9. Note that is merely an example arrangement of color filters, and SPAD pixels can be used in combination with any arrangement of color filters. For example, rather than being aligned in rows as shown in FIG. 9, SPAD pixels can be used to replace a portion of the green pixels in a Bayer pattern (e.g., every other green pixel, every fourth green pixel, etc.). As another example, rather than being associated with a particular color filter, SPAD pixels can be used as white or "clear" pixels that measure brightness across the entire visible portion of the spectrum, which can be used to infer brightness at nearby CMOS pixels (e.g., using one or more interpolation techniques).

As described above, SPAD pixels can be configured to have a much larger dynamic range than CMOS pixels, and accordingly can be used to estimate the photon flux received at the SPAD pixel regardless of the photon flux, whereas CMOS pixels have more limited dynamic range. In some embodiments, for example as described below in connection with process 1100 of FIG. 11, the photon flux at one or more SPAD pixels in image sensor 900 can be calculated and used to adjust (e.g., to correct) the brightness value of nearby CMOS pixels (e.g., using one or more interpolation techniques). Additionally or alternatively, in some embodiments, SPAD pixels can be used to determine likely brightness of the surrounding pixels in cases in which the portion of the scene corresponding to that SPAD pixel is relatively dark or relatively bright in comparison to other portions of the scene (e.g., when the portion of the scene is outside of the dynamic range of one or more of the nearby CMOS pixels).

Figure 10:
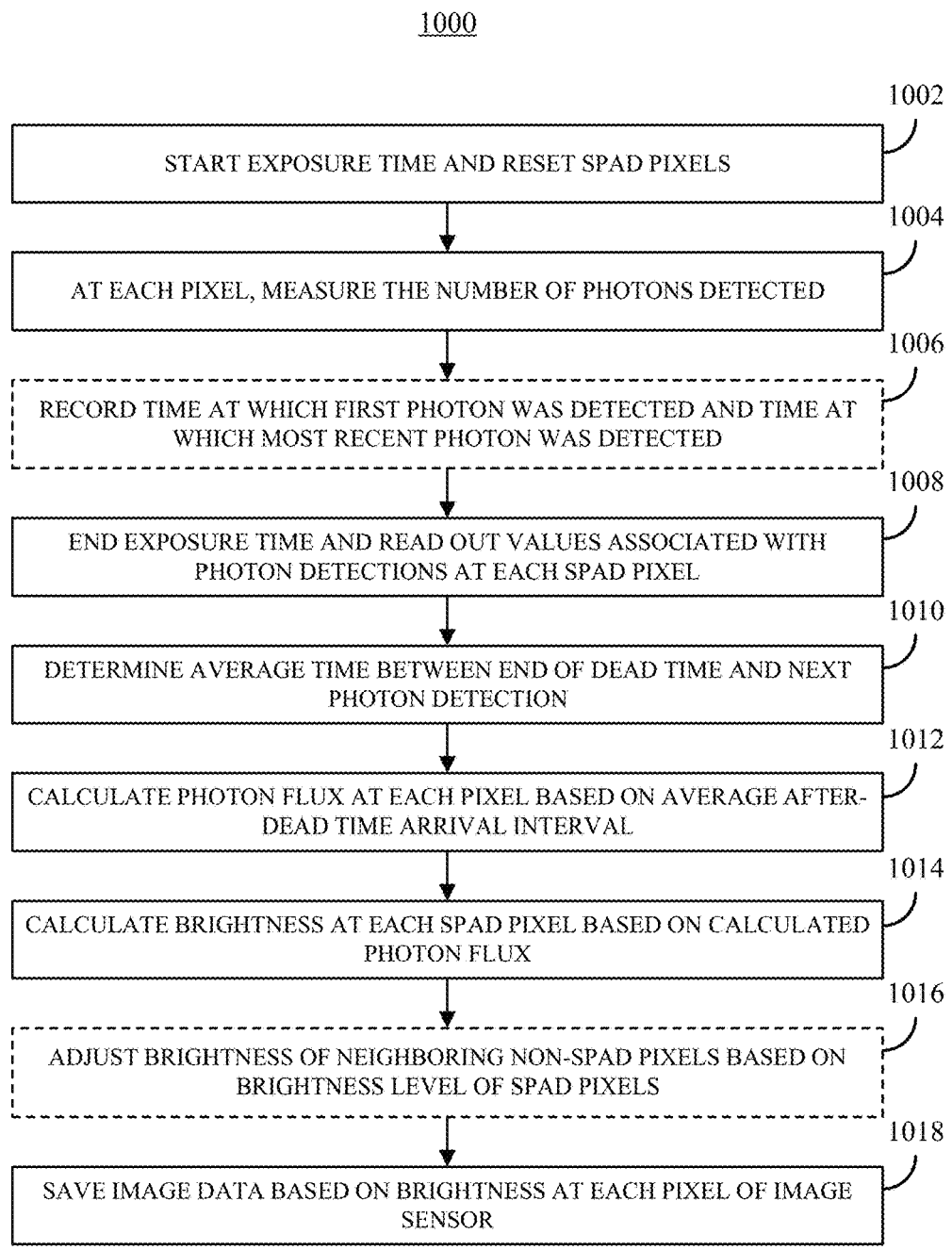
FIG. 10 shows an example 1000 of a process for generating image data using a single photon avalanche diode in accordance with some embodiments of the disclosed subject matter.

FIG. 10 shows an example 1000 of a process for generating image data using a single photon avalanche diode in accordance with some embodiments of the disclosed subject matter. As shown in FIG. 10, process 1000 can begin at 1002 by starting an exposure time and resetting SPAD pixels that are to be exposed. For example, as described above in connection with FIGS. 6 and 7, process 1000 can apply a reset signal to a counter associated with one or more SPAD pixels. As another example, process 1000 can enable one or more SPAD detectors that had been inhibited from outputting detections (e.g., by completing a connection with a counter, by completing a connection of the SPAD to a bias voltage, etc.).

At 1004, process 1000 can measure the number of photon detections that occur at each SPAD pixel. As described above in connection with FIGS. 6 and 7, process 1000 can measure the number of avalanches using a counter coupled to an output of the SPAD detector.

At 1006, in some embodiments, process 1000 can record the time at which the first photon was detected at each SPAD pixel that is being exposed, and can record the time at which the most recent photon was detected at each SPAD pixel that is being exposed. For example, as described above in connection with FIG. 7, a SPAD pixel can be associated with a TDC and registers that are configured to record the time at which detection events occurred.

At 1008, process 1000 can end the exposure time for the SPAD pixels for which the exposure time was started at 1002. In some embodiments, process 1000 can end the exposure time using any suitable technique or combination of techniques. For example, process 1000 initiate a readout of a counter associated with the SPAD pixel and/or any registers associated with the SAPD pixel. As another example, process 1000 can interrupt a connection between the output of the SPAD detector and the counter and/or TDC associated with the SPAD pixel. As yet another example, process 1000 can interrupt a connection between the SPAD detector and a bias voltage.

At 1010, process 1000 can determine an average time between detections and/or an average time between the end of the dead time and the next detection for each SPAD pixel. As described above in connection with EQS. (1) and (2), the photon flux at a particular SPAD detector can be estimated based on the number of detections that occur, and the dead time of the SPAD detector (and the probability q that a photon that strikes the SPAD detector causes an avalanche).

In some embodiments, the average time between detections can be approximated by dividing the total exposure time by the number of detections. In such embodiments, EQ. (2) can be used to estimate the photon flux at the SPAD pixel. Alternatively, in some embodiments, the average time between detections can be calculated based on the time difference between when the first avalanche was detected, and when the most recent avalanche was detected (e.g., as described below in connection with pixel 700 of FIG. 7). In such embodiments, as the average time can be determined more accurately, the average can be used as an approximation of $\overline{X}$, and EQ. (1) can be used to estimate the photon flux at the SPAD pixel. This can, in general, produce a more accurate average time between detections, as a gap at the beginning or end of the exposure time does not affect the average. While this more accurate average can lead to more accurate estimated photon flux, the difference in error is generally higher as the photon flux decreases, as gaps at the beginning and end of the exposure are more likely to occur at lower flux. In some embodiments, the average time between detections can be determined based on recorded times for each detection (e.g., as described below in connection with FIG. 19).

At 1012, process 1000 can calculate an estimated photon flux $\hat{\Phi}$ for each SPAD pixel based on the average interval between the end of the dead time and the next avalanche indicative of a photon detection. For example, as described above, based on the exposure time and the number of avalanche detections (e.g., determined from counter 602 of SPAD pixel 600), process 1000 can use EQ. (2) to calculate estimated photon flux $\hat{\Phi}$. As another example, as described above, based on the number of avalanche detections and the time of first and last avalanche detection within the exposure time (e.g., determined from counter 702, and registers 704 and 706 of SPAD pixel 700), process 1000 can use EQ. (1) to calculate estimated photon flux $\hat{\Phi}$. As yet another example, if the time of each avalanche is recorded, the differences between each set of arrivals can be calculated and used to calculate estimated photon flux $\hat{\Phi}$.

At 1014, process 1000 can calculate a brightness value at each SPAD pixel based on the calculated photon flux. In some embodiments, photon flux can be mapped to discrete brightness values using any suitable technique or combination of techniques. For example, process 1000 can use the photon flux to estimate scene brightness as a floating-point number (e.g., representing an absolute brightness level that can be represented in lux or watts per square meter), which can be used to represent scene brightness at that point (e.g., either alone or in combination with other information, such as in the RGBE format). As another example, photon flux can be used to estimate scene brightness as a floating-point number, and this value can be used with one or more tone mapping techniques and color information to convert the floating point number to an 8 or 16-bit RGB bitmap image.

At 1016, in some embodiments, process 1000 can use the brightness values calculated for SPAD pixels at 1014 to adjust the brightness of nearby non-SPAD (e.g., CMOS) pixels. For example, when nearby non-SPAD pixels are either saturated or black (e.g., below a threshold brightness), process 1000 can interpolate a brightness value for the overexposed or black pixel based on the values of nearby SPAD pixels and/or non-SPAD pixels that are properly exposed (e.g., neither saturated nor black). As another example, when nearby non-SPAD pixels are either saturated or black (e.g., below a threshold brightness), process 1000 can assign a brightness value for the nearby saturated or black non-SPAD pixels based on the brightness of the SPAD pixel. In such an example, neighboring non-SPAD pixels can be assigned the brightness value of the SPAD pixel. In some such examples, bright and/or dark areas of a scene may be captured at a lower spatial resolution when using brightness values from interspersed SPAD pixels to determine brightness values for those areas of the scene. However, as information from those portions of the scene would otherwise be lost due to saturation, underexposure, or noise, a lower resolution image of those portions of the scene includes more information about the scene than would otherwise be captured.

At 1018, process 1000 can save image data (e.g., to volatile or non-volatile memory) for the scene based on the brightness values associated with each pixel of the image sensor. Note that the image data can be raw image data that has not been heavily processed, and/or processed image data that is the result of one or more image processing techniques applied to the image data prior to saving. For example, one or more image processing techniques, such as gamma correction, white balance correction, color space transformation, downsampling, encoding (e.g., into a particular file format), tone mapping, etc. Additionally or alternatively, in some embodiments, process 1000 can output the image data for display and/or use in one or more other processes. For example, process 1000 can cause an image to be presented (e.g., via display 110) based on the image data. As another example, process 1000 can provide the image data to another process, such as an image classification and/or object recognition process used by an autonomous vehicle to determine the contents of a scene.

Figure 11:
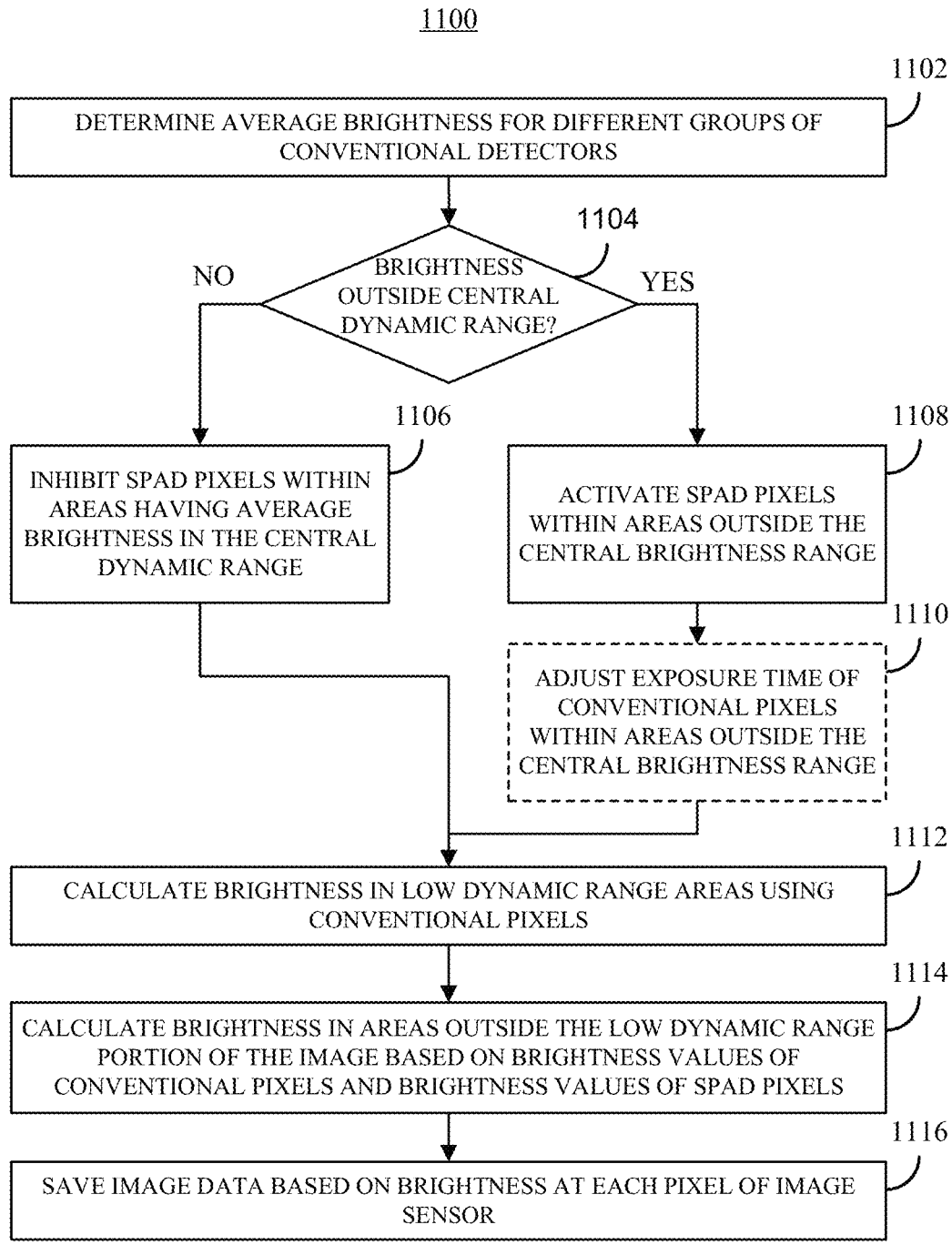
FIG. 11 shows an example 1100 of a process for generating image data using a hybrid image sensor that includes both conventional light detectors and single photon avalanche diode detectors in accordance with some embodiments of the disclosed subject matter.

FIG. 11 shows an example 1100 of a process for generating image data using a hybrid image sensor that includes both conventional light detectors and single photon avalanche diode detectors in accordance with some embodiments of the disclosed subject matter. As shown in FIG. 11, process 1100 can begin at 1102 by determining average brightness levels recorded by groups of conventional detectors (e.g., CMOS pixels) in different portions of the image sensor. For example, process 1100 can receive image data captured using conventional pixels of a hybrid image sensor that includes both conventional pixels and SPAD pixels, and can calculate the average brightness of different portions of the image data. In such an example, process 1100 can use any suitable technique or combination of techniques to determine average brightness. For example, pixels can be aggregated into predetermined groups, and the average brightness of each group can be calculated based on the individual brightness values. As another example, pixels with brightness outside of a particular range corresponding to proper exposure of the conventional pixels (e.g., outside a central portion of the dynamic range of the conventional pixels, pixels that are saturated, pixels that are dark, etc.) can be identified, and process 1100 can count the number of other pixels within a predetermined distance from the identified pixels that are also over or underexposed.

At 1104, process 1100 can determine whether the average brightness for any portion or portions of the image is outside of the central portion of the dynamic range of the conventional pixels. For portions of the image that process 1100 determines are within the central portion of the dynamic range of the conventional pixels (i.e., portions of the image that are not overexposed or underexposed) ("NO" at 1104), process 1100 can move to 1106 can inhibit SPAD pixels within the properly exposed regions of the image from being activated. Note that, because SPAD pixels may generate more heat than conventional pixels (e.g., due to the relatively large current discharge when an avalanche occurs), especially in high photon flux areas, SPAD pixels can be inhibited (i.e., deactivated) when not needed.

Otherwise, for portions of the image that process 1100 determines are outside the central portion of the dynamic range of the conventional pixels (i.e., portions of the image that are overexposed or underexposed) ("YES" at 1104), process 1100 can move to 1108 and can activate SPAD pixels within the portions to provide image data with higher dynamic range (e.g., as described above in connection with FIG. 10).

At 1110, in some embodiments, process 1100 can adjust the exposure time (and/or otherwise adjust the exposure, e.g., by adjusting the gain, by adjusting the opacity of adaptive neutral density filters, etc.) of conventional pixels within the portions that are underexposed and/or within portions that are overexposed based on the average brightness of the conventional pixels and/or based on the brightness measured by the SPAD pixels. For example, SPAD pixels can be used to determine the estimated photon flux in areas that are overexposed or underexposed, and process 1100 can use the photon flux to adjust the exposure time for those portions such that the conventional pixels are properly exposed.

At 1112, process 1100 can calculate brightness values for pixels in low dynamic range areas of the image (e.g., where the image has proper exposure) based on the brightness values of the conventional pixels in those areas. For example, as SPAD pixels can be inhibited for areas of proper exposure at 1106, brightness information from conventional pixels may be the only information available for the properly exposed areas.

At 1114, process 1100 can calculate brightness values for pixels in portions of the image that fall outside the central portion of the dynamic range based on the brightness values of the SPAD pixels and/or the conventional pixels (e.g., as described above in connection with 1016 of FIG. 10).

At 1116, process 1100 can save and/or otherwise output image data based on the brightness at each pixel (e.g., as described above in connection with 1018 of FIG. 10).

In some embodiments, SPAD pixels can be primarily used to determine the photon flux on different portions of the image sensor in order to determine a proper exposure of nearby conventional pixels. In such an example, the brightness values of the SPAD pixels can be used to adaptively set the exposure of nearby conventional pixels to implement a spatially varying exposure in real time or near real time.

Figure 12:
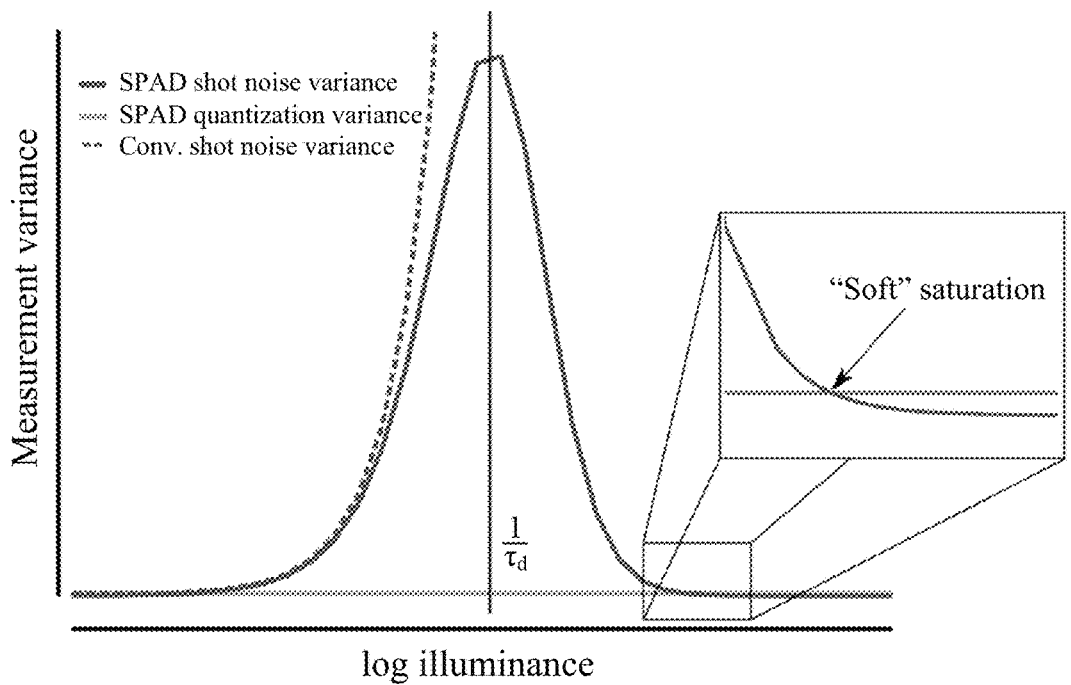
FIG. 12 shows an example of a diagram depicting variance in shot noise as a function illuminance for both a conventional charge coupled device light detector and a single photon avalanche diode detector, as well as quantization variance as a function of illuminance for a single photon avalanche diode detector.

FIG. 12 shows an example of a diagram depicting variance in shot noise as a function illuminance for both a conventional charge coupled device light detector and a single photon avalanche diode detector as well as quantization variance as a function of illuminance for a single photon avalanche diode detector. In general, the goal of an imaging sensor is to measure the radiance of each scene point in the image plane as faithfully as possible. For a monochromatic light source, brightness can be quantified using radiant flux, or the average number of photons per unit time incident on the sensor. Due to the quantum nature of light, photons arrive at the sensor at random times imposing a fundamental limit on how accurately a sensor can measure scene brightness. This source of uncertainty is called shot noise or Poisson noise and the number of photons in a fixed time interval can be approximately modeled using a Poisson distribution.

Figure 13:
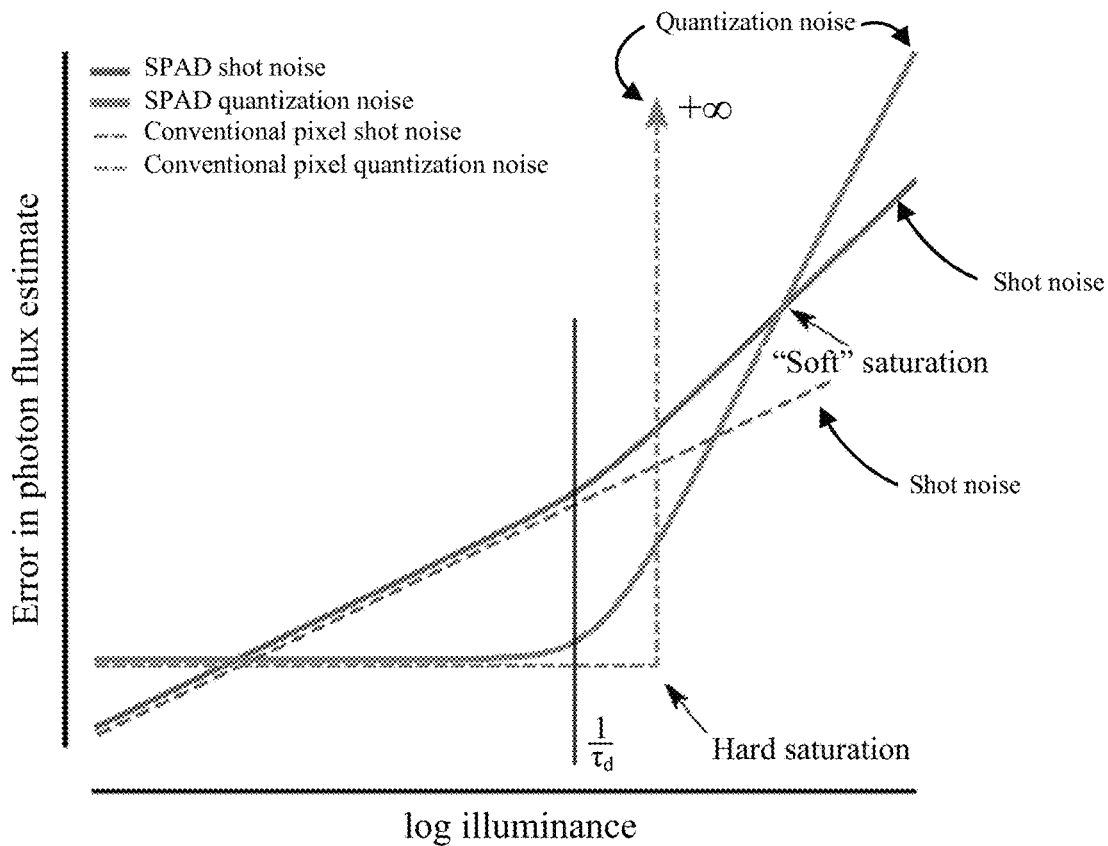
FIG. 13 shows an example of a diagram depicting the effect on flux estimates caused by shot noise as a function illuminance for both a conventional charge coupled device light detector and a single photon avalanche diode detector, as well the effect on flux estimates caused by quantization noise as a function of illuminance for both a conventional charge coupled device light detector and a single photon avalanche diode detector.

FIG. 13 shows an example of a diagram depicting the effect on flux estimates caused by shot noise as a function illuminance for both a conventional charge coupled device light detector and a single photon avalanche diode detector, as well the effect on flux estimates caused by quantization noise as a function of illuminance for both a conventional charge coupled device light detector and a single photon avalanche diode detector.

In practice, the dead time window is controlled using digital timer circuits that have a limited precision dictated by the clock speed. For example, in an experiment, a clock speed of 167 MHz was used to control a SPAD pixel, which introduces a variance of 6 ns in the duration of the dead time window. Accordingly, in some embodiments, the dead time $\tau_d$ may not be a constant, and must be treated as a random variable $T_d$ with mean $\mu_d$ and variance $\sigma_d$ and the interarrival distribution can be understood as a conditional distribution, conditioned on $T_d = \tau_d$. The mean and variance of the time between photon detections can be computed using the law of iterated expectation:

$$E[X_n] = E[E[X_n[T_d]] = \mu_d + \frac{1}{q\Phi} \text{ and}$$

$$\text{Var}[X_n] = E[(X_n - E[X_n])^2] = E[E[(X_n[T_d])^2[T_d]] = \frac{1}{q^2\Phi^2} + \sigma_d^2$$

A modified shot noise variance term equal to $$\frac{\Phi(1+\Phi^2\sigma_d^2 q^2)(1+q\Phi\mu_d)}{qT}$$

that can be used in EQ. (4) to account for dead time variance, and instances of $\tau_d$ in Eq. (4) can be replaced by its mean value $\mu_d$.

Figure 14:
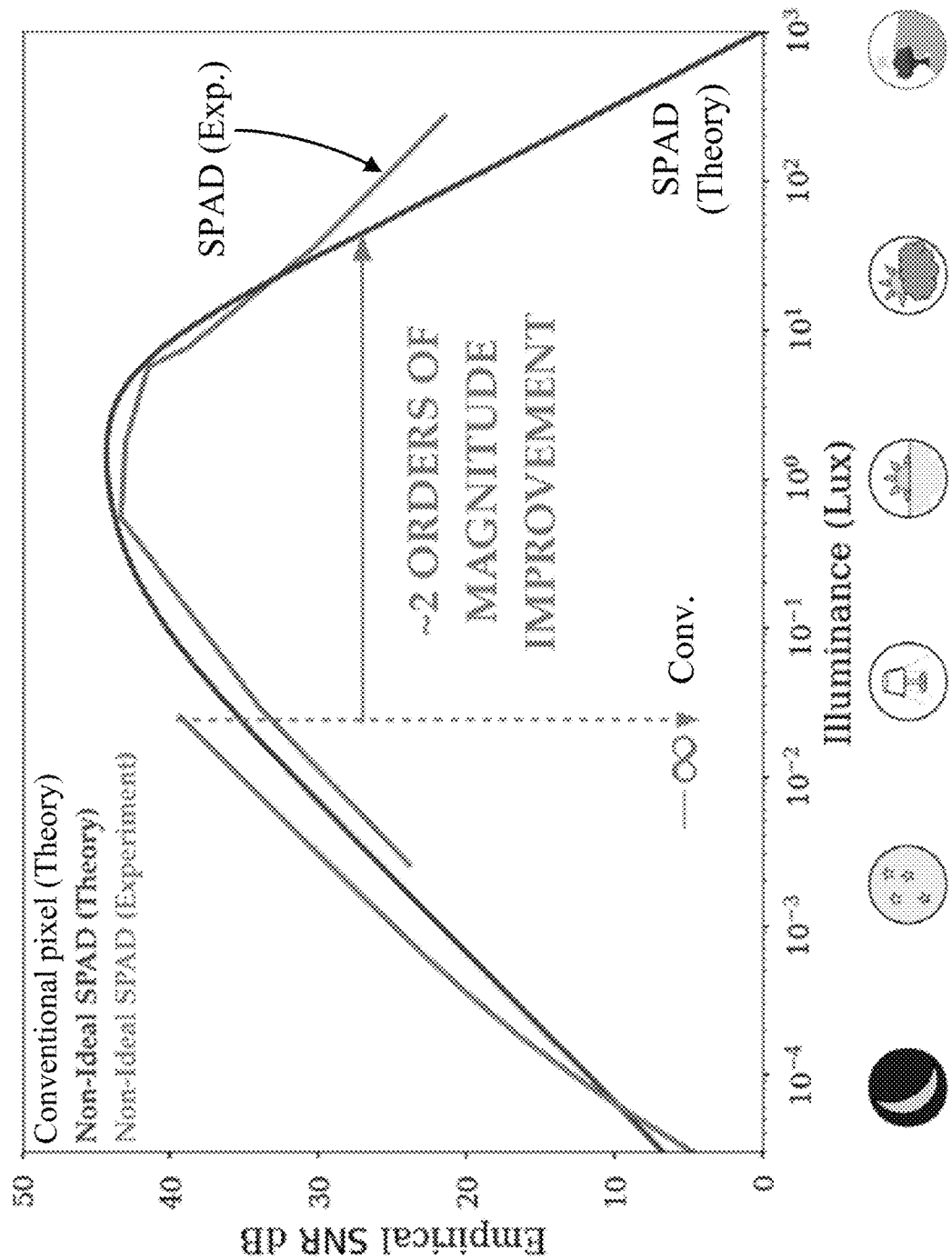
FIG. 14 shows an example of a diagram depicting theoretical signal to noise ratio as a function of illuminance for both a conventional charge coupled device light detector, and a single photon avalanche diode detector, as well as measured signal to noise ratio as a function of illuminance for a single photon avalanche diode detector.

FIG. 14 shows an example of a diagram depicting theoretical signal to noise ratio as a function of illuminance for both a conventional charge coupled device light detector, and a single photon avalanche diode detector, as well as measured signal to noise ratio as a function of illuminance for a single photon avalanche diode detector. As shown in FIG. 14, the SNR of a single SPAD pixel computed using EQ. (5) along with estimates from a Monte Carlo simulation and experimental data. The SPAD pixel for which SNR was calculated for FIG. 14 has a pitch of 25 µm, quantum efficiency of 40%, dark count rate of 100 photons/second, 3% afterpulsing probability, and a dead time of about 150 ns. The exposure time was set to 5 ms. The SNR curves show improvement in DR with a SPAD pixel implemented in accordance with some embodiments of the disclosed subject matter. For example, the SPAD pixel can theoretically provide over 3 orders of magnitude improvement in dynamic range over a comparable conventional pixel with a full well depth of 30,000 photo-electrons. An experimental hardware prototype system realized a lower, but still relatively large 2 order of magnitude improvement compared to a conventional sensor. This discrepancy is likely due to the digital electronics that control the dead time gate, and is not a fundamental limitation.

A time-domain simulation model was implemented for a SPAD pixel to validate theoretical formulas for the SPAD response curve and SNR. Photons impinged the simulated SPAD pixel according to a Poisson process, that is, a fraction of these photons are missed due to limited quantum efficiency. The simulated SPAD pixel counts an incident photon when it arrives outside a dead time window. The simulation model also accounted for spurious counts due to dark counts and afterpulsing. Theoretical SNR results were validated by averaging the output of the SPAD pixel over repeated Monte-Carlo runs for different values of incident photon flux.

The single-pixel SPAD simulator can also be used for generating synthetic color images from a hypothetical megapixel SPAD array camera. Ground truth photon flux values were obtained from an exposure bracketed HDR image that covered over 10 orders of magnitude in dynamic range. Unlike regular digital images that use 8 bit integers for each pixel value, an HDR image is represented using floating point values for each pixel that represent the true scene radiance. These floating point values were used as the ground-truth photon flux to generate a sequence of photon arrival times following Poisson process statistics. A simulated HDR image generated using the simulation is shown in FIG. 18D, described below.

Figure 15:
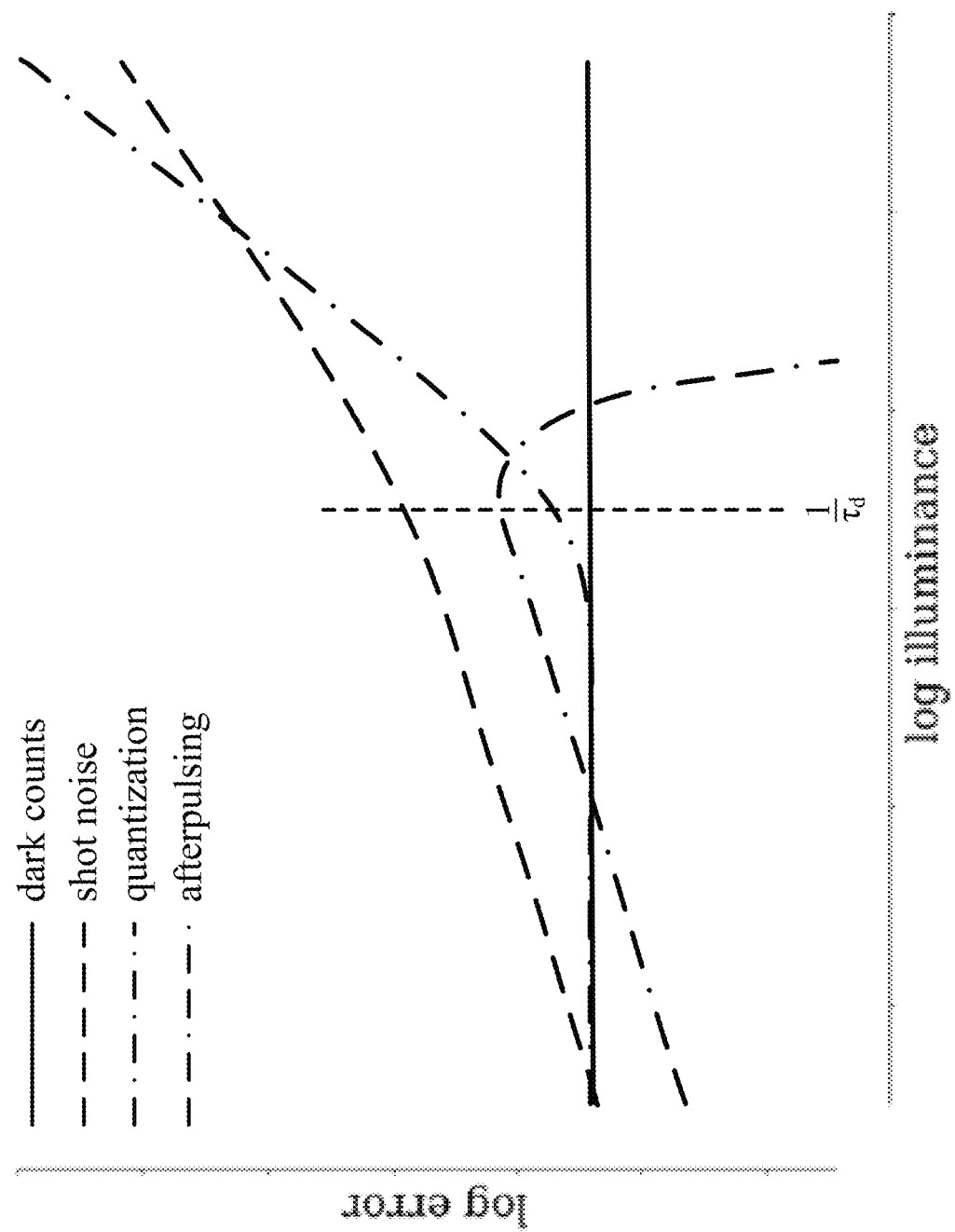
FIG. 15 shows an example of a diagram depicting the effect on flux estimates caused by various sources of error for a single photon avalanche diode detector.

FIG. 15 shows an example of a qualitative diagram depicting the effect on flux estimates caused by various sources of error for a single photon avalanche diode detector. In addition to quantization and shot noise that introduce variance in the estimated photon flux, SPADs also suffer from dark counts and afterpulsing noise that introduce an offset or bias. The dark count rate $\Phi_{dark}$ is often given in published datasheets and can be used as the bias term.

Afterpulsing noise is quoted in datasheets as afterpulsing probability which denotes the probability of observing a spurious afterpulse after the dead time $\tau_d$ has elapsed. Due to an exponentially distributed waiting time, the probability of observing a gap between true photon-induced avalanches is equal to $e^{-q\Phi\tau_d}$. A fraction $P_{ap}e^{-q\Phi\tau_d}$ of these gaps will contain afterpulses, on average. The bias $\Delta\hat{\Phi}$ in the estimated flux can be represented as:

$$\Delta\hat{\Phi} = \hat{\Phi}\frac{T}{T-N(T)\tau_d}\frac{\Delta N(T)}{N(T)}$$
$$= \frac{T}{T-N(T)\tau_d}P_{ap}e^{-q\Phi\tau_d}$$
$$= q\Phi(1+\Phi\tau_d)P_{ap}e^{-q\Phi\tau_d}$$

Using the bias-variance decomposition of mean-squared error, root mean squared error can be represented as:

$$RMSE(\hat{\Phi}) = \sqrt{\frac{(\Phi_{dark}+q\Phi(1+\Phi\tau_d)P_{ap}e^{-q\Phi\tau_d})^2+}{\frac{\Phi(1+q\Phi T)}{qT}+\frac{(1+q\Phi T)^4}{12q^2T^2}}} \quad (6)$$

and the approximate SNR can obtained by plugging EQ. (6) into EQ. (3).

The effect of dark count bias is generally only relevant when estimating extremely low photon flux values when the flux to be estimated is on the same order of magnitude as the dark counts. Somewhat surprisingly, the effect of afterpulsing bias first increases and then decreases with incident photon flux. Afterpulses are correlated with past avalanche events, and accordingly, at very low incident photon flux there are very few photon-induced avalanches which implies that there are even fewer afterpulsing avalanches. At very high photon flux values, the afterpulsing noise is overwhelmed by the large number of true photon-induced avalanches that leave negligible temporal gaps between consecutive dead time windows.

Figure 16:
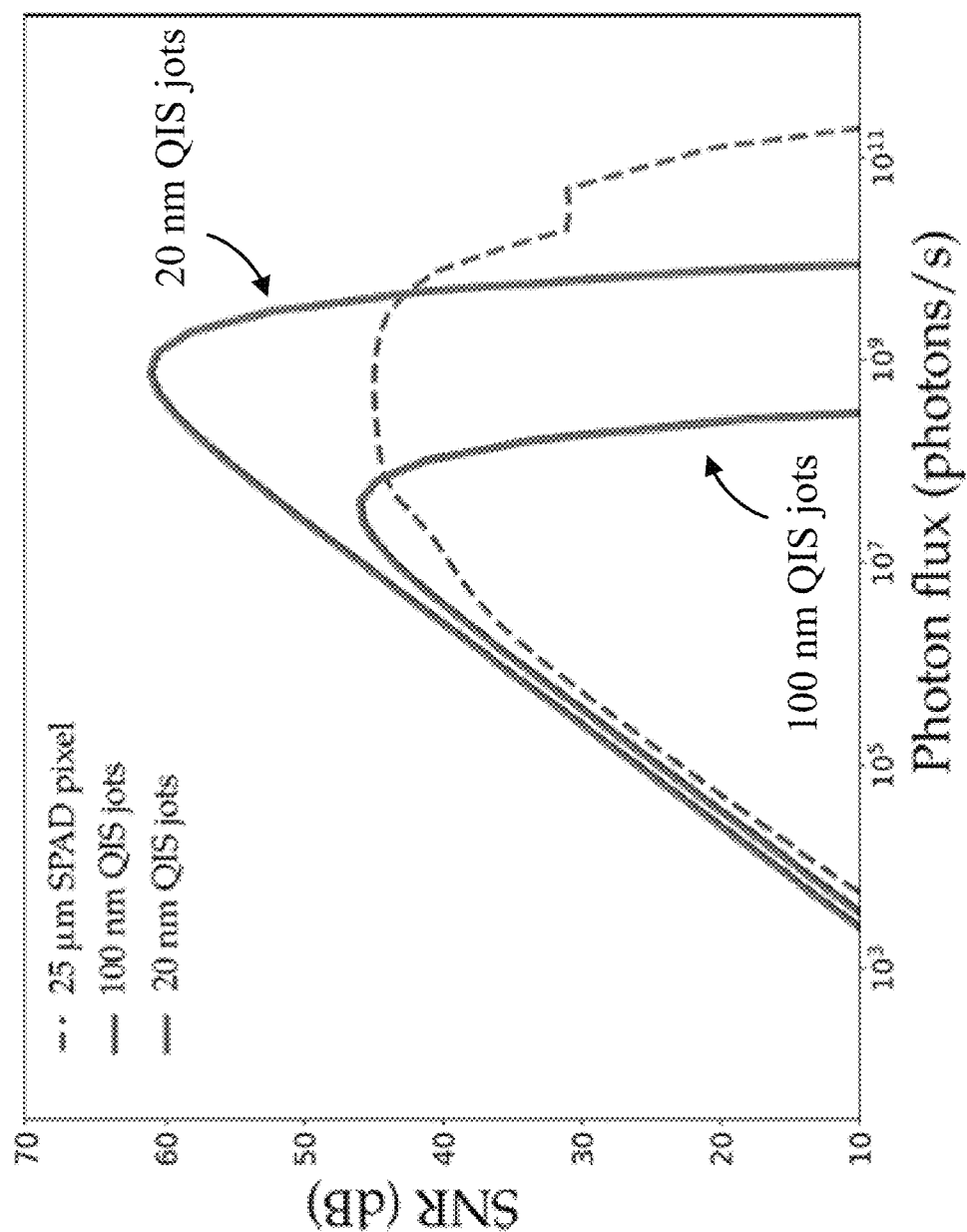
FIG. 16 shows an example of a diagram depicting theoretical signal to noise ratio as a function of illuminance for two different types of quanta image sensor detectors, and a single photon avalanche diode detector.

FIG. 16 shows an example of a diagram depicting theoretical signal to noise ratio as a function of illuminance for two different types of quanta image sensor detectors, and a single photon avalanche diode detector. A quanta image sensor uses spatial oversampling to obtain higher dynamic range than conventional image sensors. The output response of a QIS is nonlinear and is intended to mimic silver halide photographic film. Each pixel (sometimes referred to as a "jot") of a QIS array has binary output, and the final image is formed by spatio-temporally combining groups of jots (sometimes referred to as a "jot-cube"). Because a single jot only generates a binary output and must be combined into a jot-cube to generate the final image, it is difficult to conduct a fair comparison of QIS jots with a single SPAD pixel. However, one way to compare them is by computing SNR for a fixed image pixel size. A square grid of jots that spatially occupy the same area as a single SPAD pixel that has a width of 25 µm was used to generate the results shown in FIG. 16, which shows the SNR curves obtained using a theoretical derivation for a QIS jot-cube and a single SPAD pixel. These curves show that a large spatial oversampling factor and extremely small jots are required to obtain similar dynamic range as a single SPAD pixel. For example, a 20 nm jot size can accommodate over a million jots in a 25×25 µm² area occupied by the SPAD pixel. However, this is significantly (e.g., an order of magnitude) smaller jot pitch than the lower end of the recently proposed jot pitches. Additionally, as the number of jots increases, it becomes more complex to read out data from the jots in real time. Using the example above, where a 25 µm SPAD pixel can be read out with a few operations, an equivalent area of 20 nm jots would require at least one million operations to read.

The experimental SNR measurement setup included a thermo-electrically cooled fast-gated single pixel silicon SPAD module with a pixel size of 25 µm. The SPAD pixel had a timing jitter of 50 picoseconds (ps), quantum efficiency of 40% for 400 nm wavelength, dark count rate of 100 counts per second. The dead time of was programmable, and can be varied from 100 ns to 1 µs, with an afterpulsing probability of 1% when the dead time is set at 100 ns. The incident photon flux was generated using a variable brightness 400 nm-410 nm LED light source and a set of absorptive neutral density filters (Thorlabs NEK01). The incident photon flux was split between the SPAD pixel and an optical power meter (Thorlabs PM100D and Thorlabs S120C) using a pellicle beamsplitter (Thorlabs BP245B1).

FIGS. 17A to 17C show examples of images of a scene captured using a conventional CMOS image sensor exposed for a 5 ms exposure, and a 1 ms exposure, and a high dynamic range image of the scene using a scanning single photon avalanche diode detector image sensor implemented in accordance with some embodiments of the disclosed subject matter for the first amount of time.

An experimental point scanning setup included a SPAD module mounted on a pair of micro-translation stages (VT-21L Micronix USA) which were used for point-scanning the SPAD pixel in the image plane of a variable focal length lens (Fujifilm DV3.4×3.8SA-1). Photon events were recorded with a 1 ps timing resolution using a time-correlated single photon counting (TCSPC) module (PicoQuant HydraHarp 400). A monochrome machine vision camera (FLIR GS3-U3-23S6M-C) was used for qualitative comparisons with the images acquired using the SPAD setup. The machine vision camera was equipped with the same variable focal length lens with identical field of view as the scene imaged by the SPAD point scanning setup. This ensured a comparable effective incident flux on a per-pixel basis for both the SPAD and the machine vision camera.

A straightforward method for obtaining a 2D image from a single pixel sensor would involve moving the SPAD pixel at discrete locations in the image plane and capturing photons from each pixel location for a given exposure time. This "point-and-shoot" technique, however, is extremely time consuming and not practical for constructing an image with 105-106 pixels. Instead, a linear raster scanning method was used to speed up image acquisition. The image plane was raster scanned by running the translation stage at a fixed constant speed along horizontal lines. A line scan speed of 5 mm/s was used to obtain a 5 ms exposure time for the 25 µm SPAD pixel size. Photon time-stamps were captured in a single list for each horizontal line in the raster scan. These timestamps were binned into consecutive exposure intervals of 5 ms each to obtain photon counts for each pixel along the horizontal scan line.

Since the SPAD sensor in the experimental setup has only one pixel, it must be moved in a grid pattern in the image plane using a pair of translation stages to form a complete image. A 512×512 pixel grid capture of a static scene takes about 20 minutes with this raster scanning method. The resulting single-shot HDR image from the experimental SPAD setup is shown in FIG. 17C. This image qualitatively shows that a CMOS camera cannot capture the full dynamic range of the scene in a single capture and provide further support for the DR improvements shown quantitatively in FIG. 14. Color images can potentially be captured by combining three monochrome images with red, green and blue color filters in front of the lens. Although this comparison is only qualitative, care was taken to set the SPAD and CMOS cameras in such a way that they had identical fields of view and the same amount of radiant flux on a per pixel basis.

It is important to use an accurate estimate of dead time when using the nonlinear relationship in EQ. (1). The true dead time of the experimental SPAD pixel was estimated by saturating the SPAD pixel with a bright light source. The number of photons at saturation $N_{max}$ in the given exposure time T was used to estimate dead time $\tau_d = T/N_{max}$. This process was repeated many times to ensure that $N_{max}$ was in fact the saturation count.

FIGS. 18A to 18D show examples of images generated from a simulation model for SPAD and conventional pixels. The ground truth photon flux image shown in FIG. 18A was obtained from an exposure bracketed high dynamic range image captured using a Canon EOS Rebel T5 DSLR camera with 10 f-stops. The simulated CMOS pixels had a full well capacity of 30,000 photo-electrons, 90% quantum efficiency and electronic read-noise simulated by a zero-mean Gaussian distribution with a standard deviation of 5 electrons, and exposure times of 0.04 ms and 5 ms. The SPAD pixel had the same parameters as the one described above in connection with FIGS. 16 and 17A to 17D. Red, green and blue color channels were simulated independently.

In some embodiments, any suitable computer readable media can be used for storing instructions for performing the functions and/or processes described herein. For example, in some embodiments, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as RAM, Flash memory, electrically programmable read only memory (EPROM), electrically erasable programmable read only memory (EEPROM), etc.), any suitable media that is not fleeting or devoid of any semblance of permanence during transmission, and/or any suitable tangible media. As another example, transitory computer readable media can include signals on networks, in wires, conductors, optical fibers, circuits, or any suitable media that is fleeting and devoid of any semblance of permanence during transmission, and/or any suitable intangible media.

It should be noted that, as used herein, the term mechanism can encompass hardware, software, firmware, or any suitable combination thereof.

It should be understood that the above described steps of the processes of FIGS. 10 and 11 can be executed or performed in any order or sequence not limited to the order and sequence shown and described in the figures. Also, some of the above steps of the processes of FIGS. 10 and 11 can be executed or performed substantially simultaneously where appropriate or in parallel to reduce latency and processing times.

Although the invention has been described and illustrated in the foregoing illustrative embodiments, it is understood that the present disclosure has been made only by way of example, and that numerous changes in the details of implementation of the invention can be made without departing from the spirit and scope of the invention, which is limited only by the claims that follow. Features of the disclosed embodiments can be combined and rearranged in various ways.

What is claimed is:

1. A system for high dynamic range imaging, the system comprising:
an image sensor comprising:
a pixel comprising:
a single photon detector configured to detect the arrival of a single photon, and having a dead time $\tau_d$ that is triggered by a detection of a photon and that ends when a predetermined time has elapsed from the time at which the photon is detected; and
a counter coupled to an output of the single photon detector, wherein the counter is configured to increment in response to a signal indicative of detection of a photon output by the single photon detector; and
a processor that is programmed to:
read out, from the pixel, a value stored by the counter after an exposure time has elapsed; and
calculate an intensity value for the pixel based on the value stored by the counter and the dead time $\tau_d$.

2. The system of claim 1, wherein the pixel further comprises:
a fast timing circuit coupled to the output of the single photon detector and configured to output a value indicative of a time at which a signal indicative of detection of a photon is output by the single photon detector;
a first register coupled to an output of the fast timing circuit, wherein the first register is configured to store a value indicative of a time at which a first signal indicative of detection of a photon was output by the single photon detector during the exposure time; and
a second register coupled to the output of the fast timing circuit, wherein the second register is configured to store a value indicative of a time at which a last signal indicative of detection of a photon was output by the single photon detector during the exposure time.

3. The system of claim 2, wherein the processor is further programmed to:
read out, from the pixel, a first time from the first register;
read out, from the pixel, a second time from the second register; and
calculate an average time between signals indicative of detection of a photon based on the first time, the second time, and the value stored by the counter.

4. The system of claim 3, wherein the processor is further programmed to:
calculate an estimated photon flux $\hat{\Phi}$ based on the relationship $$\hat{\Phi} = \frac{1}{q}\left(\frac{1}{(\overline{X} - \tau_d)}\right),$$

where q is the quantum efficiency of the single photon detector, and $\overline{X}$ is the average time between signals indicative of detection of a photon output by the single photon detector.

5. The system of claim 2, wherein the fast timing circuit is a time-to-digital converter (TDC).

6. The system of claim 1, wherein the processor is further programmed to reset the counter at the beginning of the exposure time.

7. The system of claim 1, wherein the processor is further programmed to:
calculate an estimated photon flux $\hat{\Phi}$ based on the relationship $$\hat{\Phi} = \frac{1}{q}\frac{N(T)}{T - N(T)\tau_d},$$

where q is the quantum efficiency of the single photon detector, T is the exposure time, and N(T) is the value read from the counter.

8. The system of claim 1, wherein the single photon detector comprises a single photon avalanche diode (SPAD).

9. The system of claim 1, wherein the image sensor further comprises a plurality of pixels, each of the plurality of pixels comprising a single photon detector and a counter, and the processor is further programmed to generate image data based on calculated intensity values associated with each of the plurality of pixels and the intensity value associated with the pixel.

10. The system of claim 1, wherein the image sensor further comprises a plurality of CMOS pixels, and wherein the pixel is adjacent to at least three CMOS pixels of the plurality of CMOS pixels, and the processor is further programmed to generate image data based on calculated intensity values associated with at least a subset of the plurality of CMOS pixels and the intensity value associated with the pixel.

11. A method for high dynamic range imaging using an image sensor comprising a pixel, the pixel comprising a single photon detector configured to detect the arrival of a single photon, and having a dead time $\tau_d$ that is triggered by a detection of the photon and that ends when a predetermined time has elapsed from the time at which the photon is detected, and a counter coupled to an output of the single photon detector, wherein the counter is configured to increment in response to a signal indicative of detection of a photon output by the single photon detector, the method comprising:
reading out, from the pixel, a value stored by the counter after an exposure time has elapsed; and
calculating an intensity value for the pixel based on the value stored by the counter and the dead time $\tau_d$.

12. The method of claim 11, wherein the pixel further comprises a fast timing circuit configured to output a value indicative of a time at which a signal indicative of detection of a photon is output by the single photon detector, a first register, and a second register, the method further comprising:
receiving, at the fast timing circuit, an output from the single photon detector indicative of detection of a photon;
in response to receiving the output from the single photon detector indicative of detection of a photon, outputting a value indicative of a current time from the fast timing circuit to the first register and the second register;
recording, using the first register, a value indicative of a time at which a first signal indicative of detection of a photon was output by the single photon detector; and
recording, using the second register, a value indicative of a time at which a last signal indicative of detection of a photon was output by the single photon detector.

13. The method of claim 12, further comprising:
reading out, from the pixel, a first time from the first register;

reading out, from the pixel, a second time from the second register; and calculating, for each of the plurality of pixels, an average time between signals indicative of detection of a photon based on the first time, the second time, and the value stored by the counter.

14. The method of claim 13, further comprising calculating an estimated photon flux $\hat{\Phi}$ based on the relationship $$\hat{\Phi} = \frac{1}{q}\left(\frac{1}{(\overline{X} - \tau_d)}\right),$$

where q is the quantum efficiency of the single photon detector, and $\overline{X}$ is the average time between signals indicative of detection of a photon output by the single photon detector.

15. The method of claim 12, wherein the fast timing circuit is a time-to-digital converter (TDC).

16. The method of claim 11, further comprising resetting the counter at the beginning of the exposure time.

17. The method of claim 11, further comprising calculating an estimated photon flux $\hat{\Phi}$ based on the relationship $$\hat{\Phi} = \frac{1}{q}\frac{N(T)}{T - N(T)\tau_d},$$

where q is the quantum efficiency of the single photon detector, T is the exposure time, and N(T) is the value output from the counter.

18. The method of claim 11, wherein the single photon detector comprises a single photon avalanche diode (SPAD).

19. The method of claim 11, wherein the image sensor further comprises a plurality of pixels, each of the plurality of pixels comprising a single photon detector and a counter, the method further comprising generating image data based on calculated intensity values associated with each of the plurality of pixels and the intensity value associated with the pixel.

20. A non-transitory computer readable medium containing computer executable instructions that, when executed by a processor, cause the processor to perform a method for high dynamic range imaging using an image sensor comprising a pixel, the pixel comprising a single photon detector configured to detect the arrival of a single photon, and having a dead time $\tau_d$ that is triggered by a detection of a photon and that ends when a predetermined time has elapsed from the time at which the photon is detected, and a counter coupled to an output of the single photon detector, wherein the counter is configured to increment in response to a signal indicative of detection of a photon output by the single photon detector, the method comprising:

reading out, from the pixel, a value stored by the counter after an exposure time has elapsed; and calculating an intensity value for the pixel based on the value stored by the counter and the dead time $\tau_d$.

21. The non-transitory computer readable medium of claim 20, wherein the pixel further comprises a fast timing circuit configured to output a value indicative of a time at which a signal indicative of detection of a photon is output by the single photon detector, a first register, and a second register, wherein the method further comprises:

receiving, at the fast timing circuit, an output from the single photon detector indicative of detection of a photon;

in response to receiving the output from the single photon detector indicative of detection of a photon, outputting a value indicative of a current time from the fast timing circuit to the first register and the second register;

recording, using the first register, a value indicative of a time at which a first signal indicative of detection of a photon was output by the single photon detector; and recording, using the second register, a value indicative of a time at which a last signal indicative of detection of a photon was output by the single photon detector.

22. The non-transitory computer readable medium of claim 21, wherein the method further comprises:

reading out, from the pixel, a first time from the first register;

reading out, from the pixel, a second time from the second register; and calculating, for each of the plurality of pixels, an average time between signals indicative of detection of a photon based on the first time, the second time, and the value stored by the counter.

23. The non-transitory computer readable medium of claim 22, wherein the method further comprises calculating an estimated photon flux $\hat{\Phi}$ based on the relationship $$\hat{\Phi} = \frac{1}{q}\left(\frac{1}{(\overline{X} - \tau_d)}\right),$$

where q is the quantum efficiency of the single photon detector, and $\overline{X}$ is the average time between signals indicative of detection of a photon output by the single photon detector.

24. The non-transitory computer readable medium of claim 20, wherein the method further comprises resetting the counter at the beginning of the exposure time.

25. The non-transitory computer readable medium of claim 20, wherein the method further comprises calculating an estimated photon flux $\hat{\Phi}$ based on the relationship $$\hat{\Phi} = \frac{1}{q}\frac{N(T)}{T - N(T)\tau_d},$$

where q is the quantum efficiency of the single photon detector, T is the exposure time, and N(T) is the value output from the counter.

26. The non-transitory computer readable medium of claim 20, wherein the single photon detector comprises a single photon avalanche diode (SPAD).

27. The non-transitory computer readable medium of claim 20, wherein the image sensor further comprises a plurality of pixels, each of the plurality of pixels comprising a single photon detector and a counter, the method further comprising generating image data based on calculated intensity values associated with each of the plurality of pixels and the intensity value associated with the pixel.

* * * * *